(12) United States Patent
Bremensdorfer et al.

(10) Patent No.: US 12,399,064 B2
(45) Date of Patent: Aug. 26, 2025

(54) SYSTEMS AND METHODS FOR THERMAL PROCESSING AND TEMPERATURE MEASUREMENT OF A WORKPIECE AT LOW TEMPERATURES

(71) Applicants: Mattson Technology, Inc., Fremont, CA (US); Beijing E-Town Semiconductor Technology Co., Ltd., Beijing (CN)

(72) Inventors: Rolf Bremensdorfer, Bibertal (DE); Markus Lieberer, Augsburg (DE); Paul J. Timans, Cambridge (GB); Michael X. Yang, Palo Alto, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 654 days.

(21) Appl. No.: 16/508,429

(22) Filed: Jul. 11, 2019

(65) Prior Publication Data

US 2020/0064198 A1 Feb. 27, 2020

Related U.S. Application Data

(60) Provisional application No. 62/725,414, filed on Aug. 31, 2018, provisional application No. 62/720,967, filed on Aug. 22, 2018.

(51) Int. Cl.
*G01J 5/00* (2022.01)
*B23K 26/03* (2006.01)
(Continued)

(52) U.S. Cl.
CPC .......... *G01J 5/0007* (2013.01); *B23K 26/032* (2013.01); *B23K 26/034* (2013.01); *G01J 5/061* (2013.01);
(Continued)

(58) Field of Classification Search
CPC ......... H01L 27/14621; H01L 27/14623; H01L 27/14625; H01L 27/14627;
(Continued)

(56) References Cited

U.S. PATENT DOCUMENTS 4,555,720 A * 11/1985 Readhead ......... H01L 27/14881
257/E31.054
4,939,043 A * 7/1990 Biricik ..................... G02B 1/02
428/641
(Continued)

FOREIGN PATENT DOCUMENTS

CN 1939050 A * 3/2007 ................ G01J 5/60
CN 101258387 A * 9/2008 ............ G01J 5/0003
(Continued)

OTHER PUBLICATIONS

U.S. Appl. No. 16/508,429, filed Oct. 25, 2023_CA_2328266_A1_H.pdf, Jul. 2001.*
(Continued)

*Primary Examiner* — Randy W Gibson
(74) *Attorney, Agent, or Firm* — Dority & Manning, P.A.

(57) ABSTRACT

Systems and methods for thermal processing of a workpiece at low temperatures are disclosed. In one example implementation, a thermal processing apparatus includes a processing chamber having a workpiece support. The workpiece support can be configured to support a workpiece. The apparatus can include one or more heat sources configured to emit electromagnetic radiation in a first wavelength range to heat the workpiece to a processing temperature. The processing temperature can be in the range of about 50° C. to 150° C. The apparatus can include one or more sensors configured to obtain a measurement of electromagnetic radiation in a second wavelength range when the workpiece
(Continued)

is at the processing temperature. The second wavelength range can be different from the first wavelength range.

14 Claims, 8 Drawing Sheets

(51) Int. Cl.
  *G01J 5/061* (2022.01)
  *H01L 21/324* (2006.01)
(52) U.S. Cl.
  CPC ...... *H01L 21/324* (2013.01); *G01J 2005/063* (2013.01)
(58) Field of Classification Search
  CPC ......... H01L 27/14629; H01L 27/14636; H01L 27/1464; H01L 27/14645; H01L 27/14647; H01L 27/307; H01L 2924/00014; H01L 21/0231; H01L 21/428; H01L 2924/00; H01L 21/67253; H01L 22/34; H01L 21/02675; H01L 21/2026; H01L 21/2636; H01L 21/67109; H01L 21/67225; H01L 21/8238; H01L 22/00; H01L 22/20; H01L 21/00; G01J 5/0007; G01J 5/061; G01J 2005/063; B23K 26/032; B23K 26/034
  USPC .................................................. 374/178, 121
  See application file for complete search history.

(56) References Cited

U.S. PATENT DOCUMENTS

| | | | | |
|---|---|---|---|---|
| 5,114,242 | A * | 5/1992 | Gat | G01J 5/0003 374/129 |
| 5,317,656 | A | 5/1994 | Moslehi et al. | |
| 5,443,315 | A * | 8/1995 | Lee | G01J 5/53 374/126 |
| 5,483,363 | A * | 1/1996 | Holmes | G06K 19/16 359/24 |
| 5,508,934 | A * | 4/1996 | Moslehi | G01J 5/0003 700/121 |
| 5,738,440 | A * | 4/1998 | O'Neill | G01J 5/0802 250/339.04 |
| 5,861,609 | A * | 1/1999 | Kaltenbrunner | H05B 3/0047 219/390 |
| 6,062,729 | A * | 5/2000 | Ni | G01J 5/0003 374/161 |
| 6,563,092 | B1 * | 5/2003 | Shrinivasan | H01L 21/67248 392/416 |
| 7,616,872 | B2 | 11/2009 | Camm et al. | |
| 8,041,197 | B2 | 10/2011 | Kasai et al. | |
| 8,254,767 | B2 | 8/2012 | Hunter et al. | |
| 10,190,915 | B2 | 1/2019 | Timans et al. | |
| 2002/0048311 | A1 * | 4/2002 | Norrbakhsh | H01L 21/67248 374/161 |
| 2004/0084427 | A1 * | 5/2004 | Talwar | B23K 26/082 219/121.73 |
| 2006/0127067 | A1 * | 6/2006 | Wintenberger | F27B 5/04 219/390 |
| 2006/0223315 | A1 * | 10/2006 | Yokota | H01L 21/67115 118/724 |
| 2007/0238202 | A1 * | 10/2007 | Ranish | H01L 22/12 257/E21.53 |
| 2008/0050688 | A1 | 2/2008 | Timans | |
| 2009/0200279 | A1 | 8/2009 | Li | |
| 2009/0323759 | A1 * | 12/2009 | Govindaraju | G01J 5/0806 250/341.1 |
| 2010/0232470 | A1 * | 9/2010 | Timans | G01J 5/53 374/161 |
| 2010/0292951 | A1 | 11/2010 | Gaertner et al. | |
| 2011/0291022 | A1 | 12/2011 | Lee et al. | |
| 2012/0327970 | A1 * | 12/2012 | Haw | G01J 5/06 374/121 |
| 2014/0004716 | A1 * | 1/2014 | Koelmel | H01L 21/2636 438/795 |
| 2015/0010038 | A1 | 1/2015 | Jarboe | |
| 2015/0221535 | A1 * | 8/2015 | Nguyen | G01K 11/125 374/161 |
| 2015/0226611 | A1 * | 8/2015 | Busche | H01L 21/6833 374/121 |
| 2015/0348847 | A1 * | 12/2015 | Kuo | H01L 29/66545 438/585 |
| 2016/0356653 | A1 | 12/2016 | Stein et al. | |
| 2017/0343424 | A1 | 11/2017 | Moffitt et al. | |
| 2018/0099353 | A1 | 4/2018 | Jennings et al. | |
| 2020/0064198 | A1 | 2/2020 | Bremensdorfer et al. | |

FOREIGN PATENT DOCUMENTS

| | | | | |
|---|---|---|---|---|
| CN | 101395712 A | * | 3/2009 | ....... H01L 21/26506 |
| CN | 102076621 A | * | 5/2011 | ............ C03B 23/02 |
| CN | 102288892 A | * | 12/2011 | ......... G01R 31/2834 |
| CN | 103152845 B | * | 4/2015 | |
| CN | 109786279 A | | 5/2019 | |
| JP | 87091852 H | * | 9/1987 | |
| JP | H410689 Y2 | * | 3/1992 | |
| JP | H6104216 A | * | 4/1994 | |
| JP | 2008111079 A | * | 5/2008 | ............ C08G 59/08 |
| JP | 2017150936 A | * | 8/2017 | |
| KR | 20140108391 A | * | 9/2014 | |
| KR | 101767088 B1 | * | 8/2017 | |
| RU | 2529053 C1 | * | 9/2014 | |
| WO | WO9004189 A1 | * | 4/1990 | |
| WO | WO9637763 A1 | * | 11/1996 | |
| WO | WO-2007118730 A1 | * | 10/2007 | ............ G01J 5/0003 |
| WO | WO-2021108921 A1 | * | 6/2021 | ......... G01N 21/3563 |

OTHER PUBLICATIONS

U.S. Appl. No. 16/508,429, filed Oct. 15, 2024_CN_101395712_A_H.pdf,Mar. 25, 2009.*
U.S. Appl. No. 16/508,429, filed Oct. 15, 2024_CN_102076621_A_H.pdf,May 25, 2011.*
U.S. Appl. No. 16/508,429, filed Oct. 15, 2024_CN_1939050_A_H.pdf,Mar. 28, 2007.*
U.S. Appl. No. 16/508,429, filed Oct. 15, 2024_WO_2021108921_A1_H.pdf,Jun. 10, 2021.*
PCT International Search Report and Written Opinion for corresponding PCT Application No. PCT/US2019/041326, mailed on Oct. 31, 2019, 14 pages.
International Preliminary Report on Patentability for PCT/US2019/041326, mailed on Feb. 23, 2021, 10 pages.

* cited by examiner

SYSTEMS AND METHODS FOR THERMAL PROCESSING AND TEMPERATURE MEASUREMENT OF A WORKPIECE AT LOW TEMPERATURES

PRIORITY CLAIM

The present application claims the benefit of priority of U.S. Provisional Application Ser. No. 62/725,414, titled "Systems and Methods for Thermal Processing and Temperature Measurement of a Workpiece at Low Temperatures," filed on Aug. 31, 2018, which is incorporated herein by reference. The present application claims the benefit of priority of U.S. Provisional Application Ser. No. 62/720,967, titled "Systems and Methods for Thermal Processing and Temperature Measurement of a Workpiece at Low Temperatures," filed on Aug. 22, 2018, which is incorporated herein by reference.

FIELD

The present disclosure relates generally to thermal processing systems for a workpiece, such as a semiconductor workpiece.

BACKGROUND

A thermal processing chamber as used herein refers to a device that can heat one or more workpiece(s), such as a semiconductor wafer. The device can include a support plate for supporting the workpiece(s) and an energy source for heating the workpiece(s), such as heating lamps, lasers, or other heat sources. During heat treatment, the workpiece(s) can be heated under controlled conditions to a preset temperature regime. For instance, the workpiece(s) can be heated by an array of lamps through the support plate to temperatures of, for instance, from about 50° C. to about 150° C., such as about 100° C. During heat treatment, a primary goal can be to measure a workpiece temperature as precisely as possible.

SUMMARY

Aspects and advantages of embodiments of the present disclosure will be set forth in part in the following description, or may be learned from the description, or may be learned through practice of the embodiments.

One example aspect of the present disclosure is directed to a thermal processing apparatus. The apparatus includes a processing chamber having a workpiece support. The workpiece support can be configured to support a workpiece. The apparatus can include one or more heat sources configured to emit electromagnetic radiation in a first wavelength range to heat the workpiece to a processing temperature. The processing temperature can be in the range of about 50° C. to 150° C. The apparatus can include one or more sensors configured to obtain a measurement of electromagnetic radiation in a second wavelength range when the workpiece is at the processing temperature. The second wavelength range can be different from the first wavelength range.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
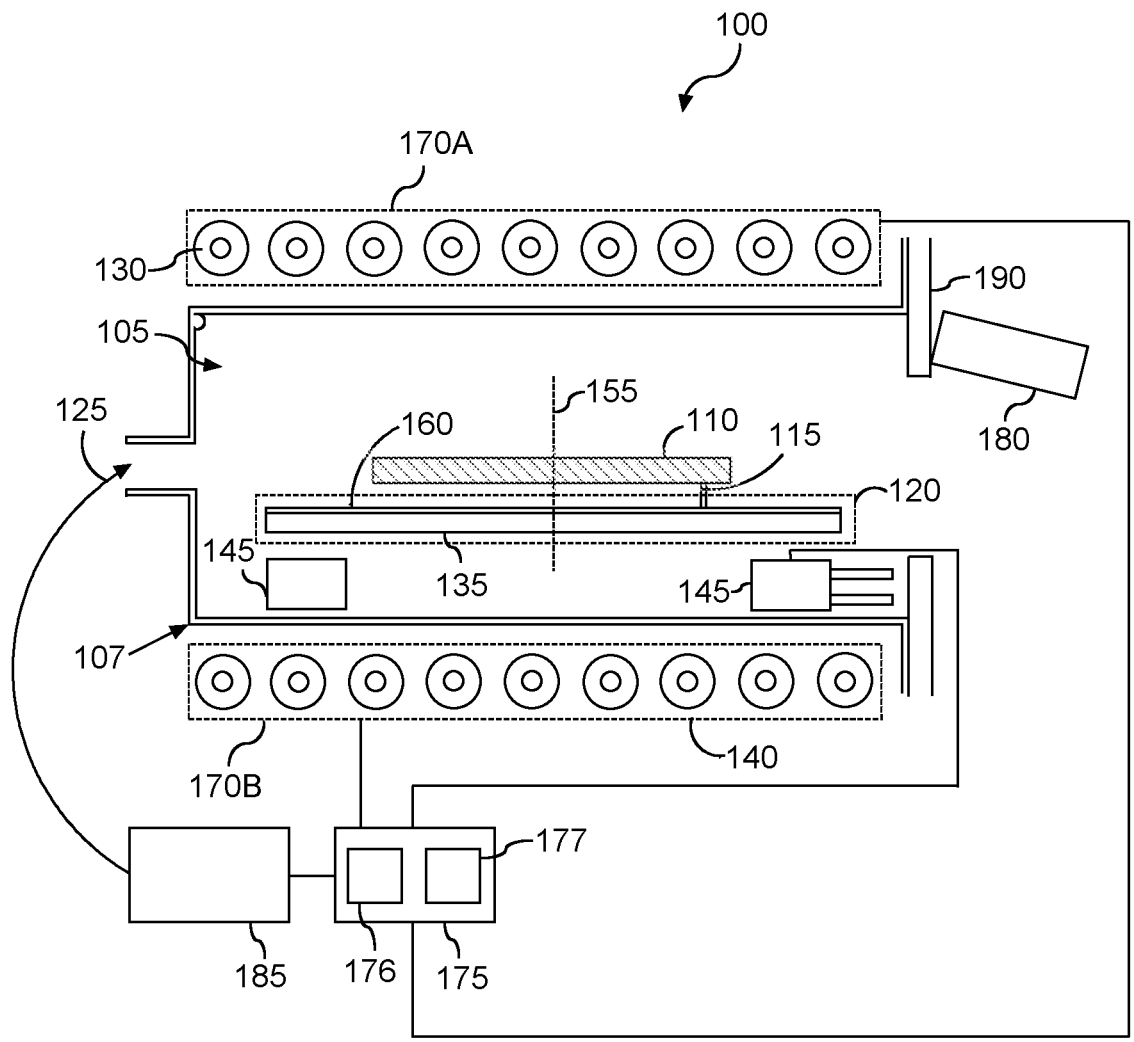
FIG. 1 depicts an example thermal processing apparatus according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to methods for thermal processing of a workpiece. More specifically, in some embodiments, example aspects of the present disclosure are directed to performing a thermal treatment process, such as doping, deposition, annealing, or any other suitable thermal treatment process, on a workpiece, such as a semiconductor workpiece. In some embodiments, the thermal treatment process can include rapid thermal processing (RTP) such as dopant activation, rapid thermal annealing (RTA), metal reflow, or any other suitable rapid thermal process. According to example aspects of the present disclosure, the thermal processing can involve heating a workpiece at a relatively low temperature, such as an ultra-low temperature, such as a temperature less than about 200° C., such as about 100° C.

Example aspects of the present disclosure may be discussed herein with reference to treating a workpiece such as a semiconductor substrate, semiconductor wafer, etc. for purposes of illustration and discussion. Those of ordinary skill in the art, using the disclosures provided herein, will understand that aspects of the present disclosure can be used in conjunction with the processing of other workpieces without deviating from the scope of the present disclosure. As used herein, the use of the term "about" in conjunction with a numerical value can refer to within 20% of the stated numerical value.

Thermal processing of a workpiece can involve heating the workpiece to a desired temperature and/or maintaining the workpiece at the desired temperature at which the process is to be performed. In some applications, it can be desirable to heat the workpiece to a relatively low temperature, such as a temperature of less than about 200° C., such as in the range of about 50° C. to about 150° C., such as about 100° C., before and/or during the thermal processing.

Various challenges can be associated with thermal processing of a workpiece at relatively low temperatures, such as at temperatures of less than about 200° C. For instance, it can be desirable during thermal processing to accurately measure the temperature of the workpiece. Various systems for thermal processing can employ non-contact temperature measurement techniques such as pyrometry to measure the temperature of the workpiece. Such non-contact temperature measurement techniques can involve measuring electromagnetic radiation, such as electromagnetic radiation emitted by the workpiece. However, the measured electromagnetic radiation can sometimes be contaminated by electromagnetic radiation from heat sources used to heat the workpiece. In addition, the absorption of electromagnetic radiation at a particular wavelength by the workpiece can change as a function of temperature. These challenges can be worsened by characteristics of the workpiece at low temperatures, such as low emissivity associated with the workpiece at low temperatures.

For example, if the workpiece is a lightly-doped silicon wafer at about 100° C., the workpiece can fail to absorb electromagnetic radiation associated with infrared light sources, such as electromagnetic radiation having a wavelength in the about 1.1 μm to about 14 μm range. One alternative to infrared light is ultraviolet (UV) radiation that has a wavelength of about 10 nm to about 400 nm. Some applications, however, may not be conducive to UV light sources or otherwise prohibit the use of UV light sources, such as broad-band UV light sources. As used herein, lightly-doped silicon refers to silicon with a resistivity that is greater than 1 ohm/cm.

As another example, non-contact temperature measurement techniques such as pyrometry can be employed to measure temperature of the workpiece without requiring direct contact with the workpiece. Such non-contact measurement techniques, for example, can measure thermal radiation emitted by the workpiece and determine temperature based on the emitted thermal radiation. At relatively low temperatures, such as temperatures below 200° C., the thermal radiation emitted by a workpiece can sometimes be insufficient to obtain an accurate measurement. These challenges can be worsened by contamination from the electromagnetic radiation emitted by the heat sources used to heat the workpiece.

To overcome these challenges, a system for thermal processing of a workpiece can include a processing chamber having a workpiece support. The workpiece support can be configured to support a workpiece. The system can include one or more heat sources configured to emit electromagnetic radiation in a first wavelength range to heat the workpiece to a processing temperature. The processing temperature can be from about 50° C. to about 150° C. (e.g., about 100° C.). The system can include one or more sensors configured to obtain a measurement of electromagnetic radiation in a second wavelength range when the workpiece is at the processing temperature. The second wavelength range can be different than the first wavelength range and can have no overlap from with the first wavelength range. In some embodiments, a spectral power density associated with radiation from the heat source in the second wavelength range can be less than about 5% of the peak spectral power density associated with the second wavelength range, such as less than about 1% of the peak spectral power density associated with the second wavelength range. According to example embodiments of the present disclosure, a temperature of the workpiece can be determined based at least in part on the measurement of electromagnetic radiation obtained by the one or more sensors.

According to example embodiments of the present disclosure, a system for thermal processing of a workpiece can include a processing chamber. The processing chamber can have any shape, configuration, and/or construction suitable to process the workpiece. Additionally, the processing chamber can include one or more additional elements to assist in thermal processing of the workpiece.

In some embodiments, the processing chamber can have a workpiece support configured to support a workpiece. The workpiece support can have any suitable shape, configuration, and/or construction to support the workpiece. In some embodiments, the workpiece support can be configured to support the workpiece while having limited effect on electromagnetic radiation in the processing chamber, such as electromagnetic radiation passing through the workpiece or thermal radiation emitted by the workpiece. For example, at least a portion of the workpiece can be adjacent to a hole in the workpiece support, allowing electromagnetic radiation to pass from one side of the workpiece to another without interference from the workpiece support. In some embodiments, the workpiece support can include additional suitable components to assist in thermal processing of the workpiece. In some embodiments, the workpiece support can include a quartz support plate with one or more support pins (e.g., quartz support pins).

In some embodiments, the workpiece can be a semiconductor workpiece, such as a workpiece composed at least in part of silicon (Si), gallium arsenide (GaAs), germanium (Ge), or other suitable semiconductor, or combination thereof. The workpiece can have any suitable shape or dimension in accordance with the present disclosure. For instance, the workpiece can be a "wafer" or substrate having a substantially circular or ovular surface.

In some embodiments, a system for thermal processing of a workpiece can include one or more heat sources configured to emit electromagnetic radiation in a first wavelength range. The one or more heat sources can be, for example, light sources or other radiative heat sources. The one or more heat sources can be operable to heat the workpiece without physical contact between the heat source and the workpiece. For example, the one or more heat sources can include infrared light sources, light-emitting diodes (LEDs), pulsed heat sources, coherent light sources (e.g., lasers), narrow-band heat sources, or other suitable heat sources, or combination thereof. For example, the one or more heat sources can be narrow-band heat sources such as LEDs to reduce or limit contamination of electromagnetic radiation outside of the first wavelength range.

The one or more heat sources can be configured to emit electromagnetic radiation in the first wavelength range to heat the workpiece. The first wavelength range can be selected such that the workpiece has a suitable absorptance, such as a suitably high absorptance, of electromagnetic radiation in the first wavelength range. For instance, the first wavelength range can have a suitably high absorptance such that the workpiece is able to absorb radiation in the first wavelength range, such as an amount of the radiation suitable to heat the workpiece in an efficient manner. For instance, the first wavelength range can include a wavelength at which the workpiece has an absorptance of about 0.3 or higher, such as about 0.5 or higher, such as 0.7 higher. By absorbing a suitable portion of the energy carried by the electromagnetic radiation, the workpiece can thus be heated. However, any suitable wavelength range can be used for the first wavelength range. In some embodiments, the workpiece can be heated to about 50° C. to 150° C., such as to about 100° C.

Additionally and/or alternatively, the first wavelength range can be selected to provide a suitable absorptance based at least in part on a temperature of the workpiece. For instance, the absorptance of the workpiece can change with temperature, and it can be desirable to select the first wavelength to provide an adequate absorptance at a desired temperature. For example, the first wavelength range can be selected to provide a suitable absorptance at an initial temperature of the workpiece (i.e. before the workpiece is heated by the one or more heat sources), at a processing temperature (i.e. a temperature at which the workpiece is heated to and/or maintained at during thermal processing), over a range of temperatures (e.g. over a range from an initial temperature to a processing temperature), or over any suitable temperature or temperatures, or combination thereof. In some embodiments, the temperature can be from about 50° C. to about 150° C. In some embodiments, the temperature can be about 100° C.

In one example application of heating a workpiece including a lightly-doped silicon wafer to a process temperature of about 100° C., the one or more heat sources can include high-power narrow band LEDs configured to provide electromagnetic radiation at about 900 nm. At 100° C., a lightly-doped silicon wafer can have an absorptance of about 0.7 for electromagnetic radiation with a wavelength of about 900 nm. The LEDs can be a narrow-band heat source having a bandwidth of less than about 200 nm, such as less than about 100 nm, such as less than about 50 nm, such as less than about 20 nm. As used herein, LED bandwidth is a half-power bandwidth, where the power radiated per unit wavelength falls to 50% of a peak power/unit wavelength. As such, the 900 nm LEDs can provide adequate capability to heat the workpiece, provide limited interference in other wavelengths, and avoid complications that may be associated with electromagnetic radiation having shorter wavelengths, such as UV light. However, any suitable heat sources with any suitable wavelength range can be used in accordance with the aspects of the present disclosure.

In some embodiments, a system for thermal processing of a workpiece can include one or more sensors configured to obtain a measurement of electromagnetic radiation in a second wavelength range. In some embodiments, the workpiece can be at least partially transparent to the second wavelength range. In some embodiments, the second wavelength range can correspond to a wavelength range at which the workpiece emits a substantial amount of thermal radiation. Based on the measurement from the one or more sensors, the temperature of the workpiece can be determined. The one or more sensors can include, for instance, a photo diode, pyrometer, or other suitable sensor.

The second wavelength range can be different from the first wavelength range and/or may not overlap with the first wavelength range. For instance, the first wavelength range and the second wavelength range can be selected to reduce or limit contamination between the first wavelength range and the second wavelength range. As an example, the second wavelength range can be selected to be a wavelength range outside of a radiation band emitted by the one or more heat sources. For example, the first wavelength range can include a wavelength of about 900 nm and the second wavelength range can include a wavelength of about 1100 nm. As another example, the second wavelength range can be a wavelength range having a different order of magnitude than the first wavelength. For example, the first wavelength range can include a wavelength having an order of magnitude of about 1000 nm, such as 900 nm, and the second wavelength range can include a wavelength having an order of magnitude of about 10 such as 16 In some embodiments, a spectral power density associated with radiation from the heat source in the second wavelength range can be less than about 5% of the peak spectral power density associated with the second wavelength range, such as less than about 1% of the peak spectral power density associated with the second wavelength range In some embodiments, the one or more sensors can obtain a measurement of electromagnetic radiation in a second wavelength range during a time at which the one or more heat sources are not emitting radiation. For example, the one or more heat sources can be pulsed on and off (e.g. at a high frequency) and the one or more sensors can obtain measurements during the times at which the one or more heat sources are off. In this example embodiment, there may be some overlap between the first wavelength range and the second wavelength range.

By pulsing the one or more heat sources in addition to and/or alternatively to obtaining a measurement in a second wavelength range different from the first wavelength range, the contamination from the one or more heat sources to the measurements taken by the one or more sensors can be reduced, allowing for accurate measurement by the one or more sensors, while still providing for efficient heating of the workpiece.

In some embodiments, despite obtaining a measurement in a second wavelength range different from the first wavelength range emitted by the one or more heat sources, the one or more sensors may nonetheless be sensitive to undesired radiation. For instance, thermal radiation from components other than the workpiece, such as thermal radiation from other components within the processing chamber, may interfere with the measurement obtained by the one or more sensors. For example, thermal radiation from components, especially components at about the same temperature as the workpiece, may fall at least partially within the second wavelength range, or otherwise serve to contaminate the measurement obtained by the one or more sensors.

In some embodiments, the one or more sensors can include a field of view of at least a portion of the workpiece through one or more windows. The one or more windows can be transparent to the second wavelength range. In some embodiments, the one or more windows can be configured to restrict wavelengths other than the second wavelength range. For instance, the one or more windows can be positioned between the workpiece and the one or more sensors to limit interference of electromagnetic radiation other than that which the one or more sensors are configured to measure, or to prevent damage to the one or more sensors from, e.g., debris or thermal conditions in the processing chamber. For example, the one or more windows can be configured to at least partially block thermal radiation from components in the processing chamber other than the workpiece. In embodiments with more than one sensor, each sensor can include a separate window, or more than one sensor can be positioned to view the workpiece through the same window. In some embodiments, the one or more windows can be implemented in a hole in a wall of the processing chamber. In some embodiments, the one or more windows can include a suitable window material, such as quartz.

In some embodiments, the field of view of the one or more sensors can be restricted by one or more cooled sight tubes and/or cooled apertures. For instance, the one or more cooled sight tubes and/or cooled apertures can be configured to reduce interference of electromagnetic radiation other than that which the one or more sensors are configured to measure, or to prevent damage to the one or more sensors from, e.g., debris or thermal conditions in the processing chamber. For example, the one or more cooled sight tubes and/or cooled apertures can direct the field of view of the one or more sensors substantially toward the workpiece to prevent interference from undesired electromagnetic radiation. For example, the cooled tubes and/or cooled apertures can be configured to at least partially block thermal radiation from components in the processing chamber other than the workpiece. As another example, the cooled sight tubes and/or cooled apertures can prevent damage to the one or more sensors.

In some embodiments, the thermal processing system can include one or more additional radiation sources configured to emit electromagnetic radiation in the second wavelength range. The one or more additional radiation sources can be positioned such that the emitted radiation is generally perpendicular (e.g., within about 10° of perpendicular) to a surface of the workpiece or has any other suitable angle with respect to the surface of the workpiece. In some embodiments, the one or more additional radiation sources can be positioned substantially opposite the one or more sensors. For example, each of the one or more additional radiation sources can be positioned on the opposite side of the processing chamber from and in linear orientation with each of the one or more sensors. Any other suitable orientation for the one or more sensors and/or the one or more additional radiation sources can be used in accordance with the present disclosure. The one or more additional radiation sources can include, for example, lasers (e.g. laser diodes), infrared light sources, ultraviolet (UV) light sources, light-emitting diodes (LEDs), pulsed radiation sources, coherent light sources, narrow-band radiation sources, or other suitable radiation sources, or combination thereof. In some embodiments, the one or more additional radiation sources can be positioned behind one or more windows.

In some embodiments, the workpiece can be at least partially transparent to the electromagnetic radiation in the second wavelength range. For example, the workpiece can have a transmittance of greater than about zero at the second wavelength range. In this way, the electromagnetic radiation in the second wavelength range can at least partially pass through the workpiece to the side of the processing chamber opposite the one or more additional radiation sources.

In some embodiments, the one or more sensors can be configured to obtain a measurement of the electromagnetic radiation at the second wavelength range after it has passed through the workpiece. In this way, the transmittance of the workpiece can be determined by comparing the intensity of electromagnetic radiation emitted by the one or more additional radiation sources to the intensity of the electromagnetic radiation measured by the one or more sensors.

In some embodiments, the intensity of the electromagnetic radiation emitted by the one or more additional radiation sources can change with respect to time, in which the measurement of electromagnetic radiation in the second wavelength range from the one or more sensors can still be used to determine the transmittance and thus the temperature of the workpiece. For instance, the change in intensity of the one or more additional radiation sources can be compensated for in the measurement of electromagnetic radiation obtained by the one or more sensors.

The measurement of electromagnetic radiation at the second wavelength range obtained by the one or more sensors can change along with the temperature of the workpiece, even if the output from the one or more additional radiation sources is constant. In this way, the measurement from the one or more sensors can be directly associated with the temperature of the workpiece (e.g. as a change in temperature between the initial temperature and the current temperature) as a function of the transmittance of the workpiece.

In some embodiments, the temperature of the workpiece can be determined based at least in part on the transmittance of the workpiece. For instance, the transmittance of the workpiece can change with the temperature of the workpiece. For example, the transmittance of the workpiece can change as a function of at least the temperature of the workpiece. Other factors that may be associated with the transmittance of the workpiece, such as but not limited to the shape of the workpiece, thickness of the workpiece, composition of the workpiece, etc. can be measured or otherwise known or determined. In some embodiments, a reference transmittance spectrum can be determined, and the transmittance of the workpiece during thermal processing can be measured. Based at least in part on a comparison between the reference transmittance spectrum and the transmittance of the workpiece, the temperature of the workpiece can be determined.

In some embodiments, the reference transmittance spectrum can be indicative of a temperature of a workpiece based at least in part on the transmittance of the workpiece. For example, in some embodiments, the reference transmission spectrum can be based at least in part on measured transmittances at a plurality of temperatures for one or more reference workpieces. The one or more reference workpieces can share one or more characteristics with the workpiece. In some embodiments, one or more of the one or more reference workpieces can be a workpiece to be thermally processed. In some embodiments, the measured transmittances can be measured in the processing chamber according to the present disclosure. In some embodiments, a separate apparatus can be used to obtain the measured transmittances.

In embodiments where the reference transmittance spectrum is based at least in part on measured transmittances, the reference transmittance spectrum can include a model or equation, lookup table, or any other suitable reference transmittance spectrum. For example, the measured transmittances can be used to extrapolate a mathematical model or equation for transmittance as a function of at least temperature. In some embodiments, the model or equation can be calibrated based at least in part on additional characteristics, such as but not limited to thickness of the workpiece, composition of the workpiece, or any other suitable characteristics, or combination thereof. For example, the model can be adjustable based on a thickness of the workpiece so that several substantially similar workpieces having varying thicknesses (e.g. within a range or percent error of thickness) can be associated with the same model. In some embodiments, a separate model or equation can be used for each thickness, and the thickness of the workpiece to be processed can be rounded to the closest thickness having a reference transmittance spectrum. In some embodiments, the model or equation can be independent of thickness.

As another example, the measured transmittances can be used to populate a lookup table correlating transmittance to temperature for a workpiece. For example, various lookup tables can be populated based at least in part on various characteristics of the workpieces from which the measurements are obtained. In some embodiments, the lookup table data can be manipulated after being retrieved based on the various characteristics. For example, if a transmittance of a workpiece measured during thermal processing falls between two values in the lookup table, the two values can be averaged by a weighted sum. As another example, a multiplier at least partially representative of some characteristic of a workpiece, such as thickness, can be used to slightly adjust the lookup table, e.g. without requiring population of an entirely different lookup table based on the characteristic.

In some embodiments, the reference transmittance spectrum can be based at least in part on approximate or simulated data, or other data that is not directly measured from a workpiece. For example, an equation or model based on physical and/or chemical properties of a workpiece can be generated for the workpiece. For example, the model can be based on a computer simulation, or based on transmittance of one or more materials comprising the workpiece, or other similar model.

In some embodiments, the reference transmittance spectrum can be calibrated to provide an accurate correlation between transmittance and temperature for a given workpiece. For example, one or more parameters, variables, etc. of a model or equation can be adjusted based on the workpiece. As another example, a reference transmittance spectrum can be selected from a plurality of candidate reference transmittance spectra for the workpiece.

In some embodiments, the reference transmittance spectrum can be calibrated by matching a reference transmittance measured from the workpiece to the reference transmittance spectrum. For example, the reference transmittance can be measured from the workpiece at a known initial temperature. In one embodiment, the reference transmittance can be compared to a candidate reference transmittance spectrum known to closely correspond to the transmittance of the workpiece to adjust the candidate reference transmittance spectrum to more accurately correspond to the workpiece. As another example, the reference transmittance can be compared to points on a plurality of candidate reference transmittance spectra to select which of the plurality of candidate reference transmittance spectra most accurately represents the workpiece, such as points associated with the temperature at which the reference transmittance is measured. Any other suitable method of calibrating a reference transmittance spectrum can be used in accordance with the present disclosure.

By correlating the measured transmittance to the reference transmittance spectrum, the temperature of the workpiece can be determined. For example, the measured transmittance can be an input into a model or equation correlating transmittance and temperature. As another example, the measured transmittance can be mapped to a point on an X-Y plot with transmittance on one axis (e.g. the ordinate) and temperature on the other (e.g. the abscissa). As another example, the measured transmittance can be an input into a lookup table of temperatures. Thus, the measured transmittance can be used to accurately and indirectly determine the temperature of the workpiece.

As another example, a signal change at the one or more sensors that occurs as a result of the change in transmittance of the workpiece can be used to determine the temperature of the workpiece. For example, at a first temperature of the workpiece, the one or more sensors can measure a first intensity of electromagnetic radiation in the second wavelength range. At a second temperature of the workpiece, the one or more sensors can measure a second intensity of electromagnetic radiation in the second wavelength range.

As an example, the temperature of the workpiece can be determined based at least in part on the difference between the first intensity and the second intensity. For example, the first temperature can be known and the second temperature can be unknown, and the first temperature and the first intensity can be used to establish a reference point on a model such as an equation, curve, set of data, or other suitable model correlating intensity and temperature (e.g. for a given workpiece). The model can be determined based on simulated or estimated data (e.g. based on one or more properties of the workpiece) and/or measured data (e.g. measured from the workpiece and/or one or more other workpieces having similar characteristics to the workpiece). For example, the model can be determined in similar fashion to the reference transmittance spectrum described above. The second intensity can then be used to establish a second point on the model, and the second temperature can thus be determined based on the second point. Any other suitable methods known in the art can be used to determine the temperature of the workpiece based on the measurement obtained by the one or more sensors.

Aspects of the present disclosure are discussed with reference to using a transmittance to determine a temperature of the workpiece. Other optical characteristics, such as reflectance can also be used to determine the temperature of the workpiece without deviating from the scope of the present disclosure. For instance, reflectance can be used as an alternative to the transmittance in cases where the workpiece is semi-transparent because the reflectance includes a component arising from internal reflection from the workpiece back surface and the magnitude of that component is affected by absorption in the workpiece.

In some embodiments, the one or more sensors can be configured to obtain a measurement of electromagnetic radiation in the second wavelength range, and the second wavelength range can encompass at least a portion of a range of thermal radiation emitted by the workpiece. The thermal radiation emitted by the workpiece can vary with the temperature of the workpiece. Thus, a measurement of thermal radiation emitted by the workpiece in the second wavelength range can be made and compared to the emissivity and/or an expected amount of thermal radiation emitted by the workpiece at the second wavelength range across a plurality of temperatures to determine the temperature of the workpiece For instance, the thermal radiation of the workpiece can be a function of both black-body radiation emitted by an ideal black body at the temperature of the workpiece and the emissivity of the workpiece. The emissivity of the workpiece can be a ratio between the amount of thermal radiation emitted by the workpiece at a particular wavelength and temperature and the amount of thermal radiation emitted by an ideal black body at the particular wavelength and temperature. In some cases, at least a portion of the black-body curve and the emissivity curve for a workpiece can be inversely related, leading to challenges in selecting a second wavelength range at which a suitably high amount of thermal radiation is emitted.

In some embodiments, to measure the thermal radiation emitted by the workpiece at a particular temperature, a wavelength band can be selected for measurement that has a relatively high magnitude on a black-body graph at the temperature while also having a relatively high emissivity constant for the workpiece.

In some embodiments, the second wavelength range can be selected based at least in part on one or more local features associated with emissivity of the workpiece. For example, an emissivity curve of the workpiece may have one or more local maxima that provide a relatively higher emissivity at a particular wavelength than at surrounding wavelengths. Especially in cases where the black-body curve and emissivity curve are inversely related, the local features can correspond to relatively desirable wavelengths for thermal radiation measurement, provided that the local features correspond to wavelengths that are desirable in view of the other considerations discussed herein. For example, the workpiece may emit a higher amount of thermal radiation in wavelengths at the one or more local features than at wavelengths immediately surrounding the one or more local features.

For example, in a particular embodiment wherein the workpiece includes a lightly-doped silicon wafer at about 100° C., the workpiece can have one or more local features associated with emissivity at 9 μm and/or 16 μm. For example, the local feature at 9 μm can be a local maximum such that the emissivity at 9 μm is sufficiently higher than the emissivity at, for example, 8 μm or 10 μm. As such, obtaining a measurement at 9 μm can be desirable for the reason that the workpiece emits a relatively high amount of thermal radiation at 9 μm in addition to having a significant magnitude associated with the black-body curve at 100° C. for 9 μm.

In some embodiments, emissivity characteristics for a workpiece can be obtained in-situ, i.e. without removing the workpiece from the processing chamber.

In some embodiments, the emissivity of a workpiece can be measured by interacting electromagnetic radiation from one or more measurement radiation sources at a known intensity with the workpiece and measuring the intensity of the electromagnetic radiation emitted by the one or more measurement radiation sources after interaction with the workpiece. For example, the one or more measurement radiation sources can be any suitable radiation source, such as the one or more heat sources used to heat the workpiece, the one or more additional radiation sources, or any other suitable radiation source. In some embodiments, the workpiece can be at least partially transparent to the electromagnetic radiation emitted by the one or more measurement radiation sources. In this way, a first portion of the electromagnetic radiation emitted by the one or more measurement radiation sources can pass through the workpiece to a side of the processing chamber opposite the one or more measurement radiation sources and a second portion of the electromagnetic radiation can be reflected off a surface of the workpiece.

For example, in an example embodiment wherein the workpiece includes a lightly-doped silicon wafer at 100° C., the workpiece may not be fully opaque for wavelengths under about 25 μm. As such, to measure the emissivity of the workpiece, both the transmittance of the workpiece and the reflectance of the workpiece can be measured. For instance, the transmittance can be determined as a ratio of the intensity of the first portion of electromagnetic radiation that has passed through the workpiece to the intensity of the electromagnetic radiation emitted by the one or more measurement radiation sources. The reflectance can be determined as a ratio of the intensity of the second portion of electromagnetic radiation that is reflected by the workpiece to the intensity of the electromagnetic radiation emitted by the one or more measurement radiation sources. Any electromagnetic radiation that is not accounted for by the sum of transmittance and reflectance thus corresponds to electromagnetic radiation absorbed by the workpiece. In thermal equilibrium, the amount of energy emitted by the workpiece can be determined to be the same as the amount of energy absorbed by the workpiece. In this way, emissivity of the workpiece can be measured.

Based on the measured temperature of the workpiece, one or more process parameters of the thermal processing system can be controlled. For instance, the measured temperature can be used in a feedback loop, and the intensity of the one or more heat sources can be controlled to adjust and/or maintain the temperature of the workpiece. For instance, the intensity of the one or more heat sources can be adjusted to heat the workpiece to a desired processing temperature.

One example embodiment of the present disclosure is directed to a thermal processing apparatus. The apparatus can include a processing chamber having a workpiece support. The workpiece support can be configured to support a workpiece. The apparatus can include one or more heat sources configured to emit electromagnetic radiation in a first wavelength range to heat the workpiece to a processing temperature. The processing temperature can be from about 50° C. to about 150° C., such as about 100° C. The apparatus can include one or more sensors configured to obtain a measurement of electromagnetic radiation in a second wavelength range when the workpiece is at the processing temperature. The second wavelength range can be different than the first wavelength range.

In some embodiments, the apparatus can include one or more processors configured to determine a temperature of the workpiece based at least in part on the measurement of electromagnetic radiation obtained by the one or more sensors.

In some embodiments, the one or more heat sources can be configured to emit electromagnetic radiation in a narrow band infrared range. The first wavelength range the first wavelength range can be from about 850 nanometers to about 950 nanometers, such as about 900 nanometers. The first wavelength range can be selected such that the workpiece has an absorptance of greater than about 0.5 at the first wavelength range and at the processing temperature, such as greater than about 0.7 at the first wavelength range and at the processing temperature. The second wavelength range can include a wavelength longer than about 1000 nanometers, such as greater than about 1100 nm. In some embodiments, the second wavelength range can include a wavelength from about 13 micrometers to about 17 micrometers, such as about 16 micrometers. In some embodiments, the second wavelength range can be a wavelength from about 7 micrometers to about 12 micrometers, such as about 9 micrometers. In some embodiments, there is no overlap between the first wavelength range and the second wavelength range.

In some embodiments, the one or more sensors can include a field of view of at least a portion of the workpiece through one or more windows that are transparent to the second wavelength range. The apparatus can include a cooled aperture or a cooled tube to restrict the field of view of the one or more sensors.

In some embodiments, the one or more sensors are configured to measure electromagnetic radiation in the second wavelength range during a time period when the one or more heat sources are not emitting electromagnetic radiation in the first wavelength range.

In some embodiments, the one or more heat sources comprise one or more light emitting diodes. The workpiece can include a semiconductor. For instance, the workpiece can include silicon and/or lightly doped silicon.

In some embodiments, the apparatus can include one or more additional radiation sources configured to emit electromagnetic radiation in the second wavelength range. The workpiece can be at least partially transparent to the electromagnetic radiation in the second wavelength range. The electromagnetic radiation in the second wavelength range can pass through the workpiece prior to being measured by the one or more sensors.

In some embodiments, the measurement obtained by the one or more sensors is indicative of a transmittance of the workpiece. The one or more processors can be configured to determine the temperature of the workpiece at least in part by comparing the measurement obtained by the one or more sensors indicative of the transmittance of the workpiece to a reference transmittance spectrum for a specimen having a known initial temperature.

In some embodiments, the one or more processors are configured to determine the temperature of the workpiece based at least in part on an emissivity of the workpiece. The emissivity of the workpiece can be measured in-situ. The emissivity of the workpiece can be measured by providing electromagnetic radiation having a known intensity to the workpiece and measuring intensity of the electromagnetic radiation after interaction with the workpiece. The emissivity of the workpiece can be measured based at least in part on a reflectance of the workpiece, a transmittance of the workpiece, or a combination thereof.

A method for thermal processing of a workpiece. The method can include heating the workpiece to a processing temperature using one or more heat sources. The one or more heat sources can be configured to emit electromagnetic radiation in a first wavelength range. The method can include measuring electromagnetic radiation in a second wavelength range at one or more sensors while the workpiece is at the processing temperature. The second wavelength range can be different from the first wavelength range. The method can include determining, based at least in part on the electromagnetic radiation in the second wavelength range measured by the one or more sensors, a temperature of the workpiece. In some embodiments, the method can include controlling the one or more heat sources based at least in part on the temperature of the workpiece to adjust or maintain the temperature of the workpiece.

In some embodiments, measuring the electromagnetic radiation in the second wavelength range at the one or more sensors can include emitting, by one or more additional radiation sources, electromagnetic radiation in the second wavelength range; and measuring, at the one or more sensors, the electromagnetic radiation in the second wavelength range. The electromagnetic radiation in the second wavelength range can be passed through the workpiece prior to being received at the one or more sensors.

In some embodiments, determining, based at least in part on the electromagnetic radiation in the second wavelength range measured by the one or more sensors, the temperature of the workpiece can include determining a reference transmittance spectrum associated with the workpiece; determining, based at least in part on the electromagnetic radiation in the second wavelength range measured by the one or more sensors, the transmittance of the workpiece; and determining the temperature of the workpiece based at least in part on the reference transmittance spectrum and the transmittance of the workpiece.

In some embodiments, determining, based at least in part on the electromagnetic radiation in the second wavelength range measured by the one or more sensors, the temperature of the workpiece includes determining an emissivity of the workpiece at the second wavelength range at one or more reference temperatures; and determining the temperature of the workpiece based at least in part on the emissivity of the workpiece at the second wavelength range at the one or more reference temperatures.

Another example embodiment of the present disclosure is directed to a thermal processing apparatus. The apparatus can include a processing chamber having a workpiece support. The workpiece support can be configured to support a workpiece. The apparatus can include one or more heat sources configured to emit electromagnetic radiation in a first wavelength range to heat the workpiece to a processing temperature. The processing temperature can be from about 50° C. to 150° C. The apparatus can include one or more additional radiation sources configured to emit electromagnetic radiation in a second wavelength range. The second wavelength range can be different than the first wavelength range. The workpiece can be at least partially transparent to the electromagnetic radiation in the second wavelength range. The apparatus can include one or more sensors configured to obtain a measurement of the electromagnetic radiation in the second wavelength range when the workpiece is at the processing temperature. The electromagnetic radiation in the second wavelength range can be passed through the workpiece prior to being measured by the one or more sensors. A transmittance of the workpiece can be determined based at least in part on the measurement of electromagnetic radiation obtained by the one or more sensors. A temperature of the workpiece can be determined based at least in part on the transmittance of the workpiece.

Another example embodiment of the present disclosure is directed to a thermal processing apparatus. The apparatus includes a processing chamber having a workpiece support. The workpiece support can be configured to support a workpiece. The apparatus can include one or more heat sources configured to emit electromagnetic radiation in a first wavelength range to heat the workpiece to a processing temperature, wherein the processing temperature is from about 50° C. to 150° C. The apparatus can include one or more sensors configured to obtain a measurement of electromagnetic radiation in a second wavelength range when the workpiece is at the processing temperature, wherein the second wavelength range is different than the first wavelength range. The one or more sensors determines the temperature of the workpiece based at least in part on an emissivity of the workpiece.

With reference now to the FIGS., example embodiments of the present disclosure will now be discussed in detail. FIG. 1 depicts an example thermal processing system 100 that can be used in accordance with example embodiments of the present disclosure. As illustrated, the RTP system 100 includes a processing chamber 105, a workpiece 110, a workpiece support 120, heat source arrays 170A and 170B, air bearings 145, a controller 175, a door 180, and a gas flow controller 185.

In some embodiments, the workpiece 110 can be a semiconductor workpiece, such as a workpiece composed at least in part of silicon (Si), gallium (Ga) (e.g., GaAs), germanium (Ge) (e.g., SiGe), or other suitable semiconductor, or combination thereof. The workpiece 110 can have any suitable shape or dimension in accordance with the present disclosure. For instance, the workpiece 110 can be a "wafer" or substrate having a generally circular surface.

According to example embodiments of the present disclosure, the system 100 for thermal processing of a workpiece can include a processing chamber 105. The processing chamber can have any shape, configuration, and/or construction suitable to process the workpiece 110. Additionally, the processing chamber can include one or more additional elements (not shown) to assist in thermal processing of the workpiece 110.

In some embodiments, the processing chamber 105 can include a workpiece support 120. The workpiece support 120 can be configured to support a workpiece 110. In accordance with example aspects of the present disclosure, the workpiece support 120 can have any suitable shape, configuration, and/or construction to support the workpiece 110. In some embodiments, the workpiece support 120 can be configured to support the workpiece 110 while having limited effect on electromagnetic radiation in the processing chamber, such as electromagnetic radiation passing through the workpiece 110 or thermal radiation emitted by the workpiece 110. For example, at least a portion of the workpiece 110 can be adjacent to a hole in the workpiece support 120, allowing electromagnetic radiation to pass from one side of the workpiece 110 to another without interference from the workpiece support 120. In some embodiments, the workpiece support 120 can include additional suitable components (not shown) to assist in thermal processing of the workpiece 110. In some embodiments, the workpiece support can include a quartz support plate with one or more support pins (e.g., quartz support pins).

The workpiece 110 to be processed can be supported in the processing chamber 105 (e.g., a quartz chamber) by the workpiece support 120. The workpiece support 120 can support the workpiece 110 during thermal processing. In some embodiments, the workpiece support 120 can include a rotatable base 135 and/or one or more support pins 115 (only one shown). The support pins 115 and the rotatable base 135 can transmit heat from the heat sources 170B. The support pins 115 and the rotatable base 135 can be made of quartz. The rotatable base 135 can rotate the workpiece 110 at a defined rotation orientation and at a defined rotation speed. The rotatable base 135 can be supported by the air bearings 145. Gas flow impinging on the rotatable base 135 can cause the rotatable base 135 to rotate about an axis 155. In some embodiments, the rotatable base 135 may not be present, and the workpiece 110 can only be supported by the one or more support pins 115 and/or a stationary support plate.

A guard ring (not shown) can be used to lessen edge effects of radiation from one or more edges of the workpiece 110. An end plate 190 seals the processing chamber 105, and the door 180 can allow entry of the workpiece 110 and, when closed, can allow the processing chamber 105 to be sealed and a process gas 125 to be introduced from the gas flow controller 185 into the processing chamber 105. The process gas 125 can include inert gas that does not react with the workpiece 110, and/or the process gas 125 can include a reactive gas that reacts with the material of the workpiece 110 (e.g. a semiconductor wafer, etc.) to form a layer of on the workpiece 110. The process gas 125 can be a gas that can contain a silicon compound that reacts at a heated surface of the workpiece 110 being processed to form a layer on the heated surface without consuming any material from the surface of the workpiece 110.

In some embodiments, a system for thermal processing of a workpiece can include one or more heat sources 130 configured to emit electromagnetic radiation in a first wavelength range. The one or more heat sources 130 can be, for example, light sources or other radiative heat sources. The one or more heat sources 130 can be operable to heat the workpiece without physical contact between the heat source 130 and the workpiece 110. For example, the one or more heat sources 130 can include infrared light sources, light-emitting diodes (LEDs), pulsed heat sources, coherent light sources, narrow-band heat sources, or other suitable heat sources, or combination thereof. For example, the one or more heat sources 130 can be narrow-band heat sources such as LEDs to reduce or limit emission of electromagnetic radiation outside of the first wavelength range.

The one or more heat sources 130 can be configured to emit electromagnetic radiation in the first wavelength range to heat the workpiece 110. The first wavelength range can be selected such that the workpiece has a suitable absorptance, such as a suitably high absorptance, of electromagnetic radiation in the first wavelength range. For instance, the first wavelength range can have a suitably high absorptance such that the workpiece is able to absorb radiation in the first wavelength range, such as an amount of the radiation suitable to heat the workpiece in an efficient manner. For instance, the first wavelength range can include a wavelength at which the workpiece has an absorptance of about 0.3 or higher, such as about 0.7 or higher. By absorbing a suitable portion of the energy carried by the electromagnetic radiation, the workpiece 110 can thus be heated. However, any suitable wavelength range can be used for the first wavelength range. In some embodiments, the workpiece 110 can be heated to about 50° C. to 150° C., such as to about 100° C.

Additionally and/or alternatively, the first wavelength range can be selected to provide a suitable absorptance based at least in part on a temperature of the workpiece 110. For instance, the absorptance of the workpiece 110 can change with temperature, and it can be desirable to select the first wavelength to provide an adequate absorptance at a desired temperature. For example, the first wavelength range can be selected to provide a suitable absorptance at an initial temperature of the workpiece 110 (i.e. before the workpiece 110 is heated by the one or more heat sources 130), at a processing temperature (i.e. a temperature at which the workpiece is heated to and/or maintained during thermal processing), over a range of temperatures (e.g. over a range from an initial temperature to a processing temperature), or over any suitable temperature or temperatures, or combination thereof. In some embodiments, the temperature can be a processing temperature in the range from about 50° C. to about 150° C. In some embodiments, the processing temperature can be about 100° C.

In one example application of heating a workpiece 110 including a lightly-doped silicon wafer to a process temperature of about 100° C., the one or more heat sources 130 can include high-power monochromatic LEDs configured to provide light at about 900 nm. At 100° C., a lightly-doped silicon wafer can have an absorptance of about 0.7 for electromagnetic radiation with a wavelength of about 900 nm. The LEDs 130 can be a narrow-band heat source, and thus emit negligible radiation in wavelengths other than about 900 nm. As such, the 900 nm LEDs 130 can provide adequate capability to heat the workpiece 110, provide limited interference in other wavelengths, and avoid complications that may be associated with electromagnetic radiation having shorter wavelengths, such as UV light. However, any suitable heat sources 130 with any suitable wavelength range can be used in accordance with the aspects of the present disclosure.

The two heat source arrays 170A and 170B are shown on either side of the workpiece 110. Each heat source array can include a plurality of heat sources 130. Examples of a heat source 130 can include a lamp (e.g., an incandescent lamp, etc.), a light-emitting diode LED, a laser diode, or other suitable monochromatic heat source. Each heat source can be in round, linear or other shapes. In some embodiments, the heat source arrays 170A and 170B can have the same configurations. In some implementations, the heat source arrays 170A and 170B can have linear heat sources that can be positioned in parallel to each other with open space in between. In some implementations, the heat sources arrays 170A and 170B can have round-shape heat sources that can be positioned in a close-packed (e.g., honeycomb, etc.) configuration with physical barriers in between. In some embodiments, the heat source arrays 170A and 170B can have different configurations. The heat source array 170A can have the linear heat sources, and the heat source array 170B can have the round-shape heat sources, or vice versa.

The heat source arrays 170A and 170B are discussed as having a plurality of heat sources. However, only a single heat source can be used without deviating from the scope of the present disclosure. Moreover, in some embodiments, the apparatus 100 can include only the heat source array 170A. In some embodiments, the apparatus 100 can include only the heat source array 170B. In some embodiments, the apparatus 100 can include both arrays 170A and 170B.

The controller 175 can be configured to perform some or all of the methods discussed herein. For instance, the controller can include one or more processors 176 configured to perform some or all of the methods discussed herein. The controller 175 can include one or more memory devices 177 storing one or more computer-readable instructions that, when implemented (e.g. by the one or more processors 176), perform any of the methods disclosed herein. For example, the instructions can cause the controller 175 to control aspects of the thermal processing system 100, such as an output intensity of one or more heat sources 130. As another example, the instructions can cause any of the components discussed herein, such as the controller 175 and/or one or more sensors 210 (shown in FIG. 2 and FIG. 5), to perform a temperature measurement of the workpiece 110 in accordance with the present disclosure.

Figure 2:
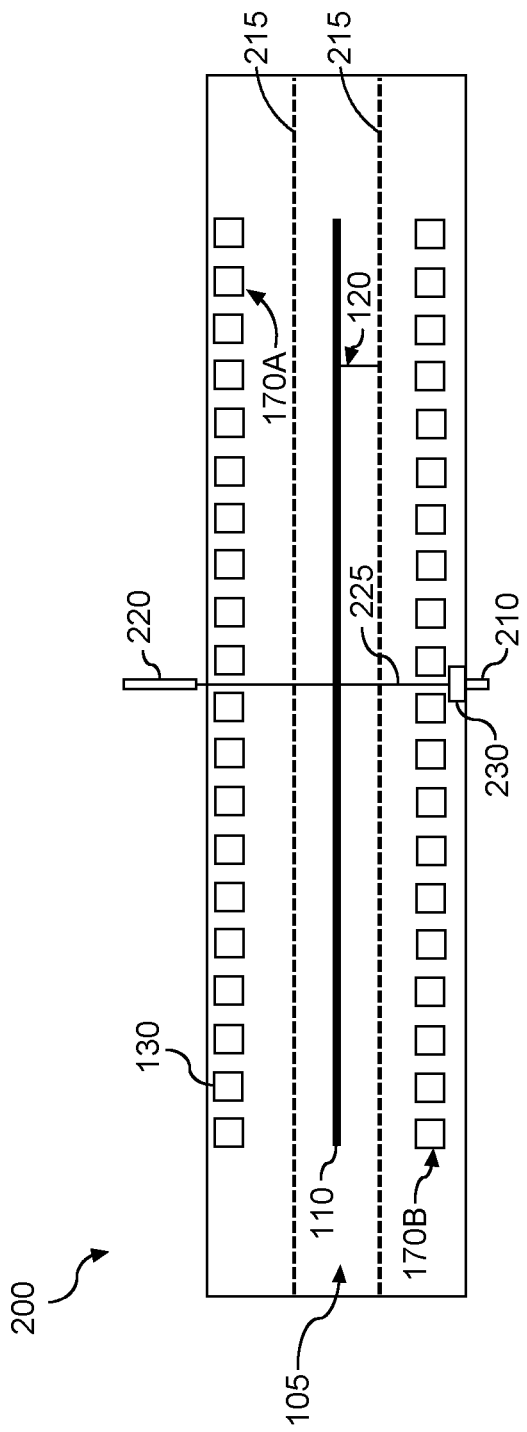
FIG. 2 depicts an example thermal processing apparatus according to example embodiments of the present disclosure.

Referring now to FIG. 2, an example thermal processing apparatus 200 is discussed with respect to the present disclosure. Some components discussed with respect to thermal processing apparatus 100 of FIG. 1 are omitted with respect to thermal processing apparatus 200 of FIG. 2 for the purposes of discussion herein. However, some embodiments of thermal processing apparatus 200 can include some or all of the components discussed with respect to FIG. 1.

Thermal processing apparatus 200 can include a processing chamber 105, one or more heat source arrays 170A, 170B having one or more heat sources 130, and a workpiece support 120 configured to support a workpiece 110 as discussed with respect to FIG. 1.

In some embodiments, the thermal processing system can include one or more additional radiation sources 220 configured to emit electromagnetic radiation in a second wavelength range 225. The one or more additional radiation sources 220 can be positioned such that the emitted radiation is generally perpendicular (e.g. within about 10° of perpendicular) to a surface of the workpiece 110 or has any other suitable angle with respect to the surface of the workpiece 110. In some embodiments, the one or more additional radiation sources 220 can be positioned substantially opposite the one or more sensors 210. For example, each of the one or more additional radiation sources 220 can be positioned on the opposite side of the processing chamber 105 from and in linear orientation with each of the one or more sensors 210. Any other suitable orientation for the one or more sensors and/or the one or more additional radiation sources can be used in accordance with the present disclosure. The one or more additional radiation sources can include, for example, lasers (e.g. laser diodes), infrared light sources, ultraviolet (UV) light sources, light-emitting diodes (LEDs), pulsed radiation sources, coherent light sources, narrow-band radiation sources, or other suitable radiation sources, or combination thereof. In some embodiments, the one or more additional radiation sources 220 can be positioned behind one or more windows 215.

The second wavelength range can be different from the first wavelength range and/or may not overlap with the first wavelength range. For instance, the first wavelength range and the second wavelength range can be selected to reduce or limit contamination between the first wavelength range and the second wavelength range. As an example, the second wavelength range can be selected to be a wavelength range outside of a radiation band emitted by the one or more heat sources 130. For example, the first wavelength range can include a wavelength of about 900 nm and the second wavelength range can include a wavelength of about 1100 nm. As another example, the second wavelength range can be a wavelength range having a different order of magnitude than the first wavelength. For example, the first wavelength range can include a wavelength having an order of magnitude of about 1000 nm, such as 900 nm. In some embodiments, a spectral power density associated with radiation from the heat source in the second wavelength range can be less than about 5% of the peak spectral power density associated with the second wavelength range, such as less than about 1% of the peak spectral power density associated with the second wavelength range.

The second wavelength range can include a wavelength having an order of magnitude of about 10 µm, such as in the range of about 13 µm to about 17 µm, such as about 16 µm. The second wavelength range in some embodiments can be in the range of about 8 µm to about 12 µm, such as about 9 µm, which may correspond to where Si—O bonds provide an absorption/emission peak.

Thermal processing apparatus 200 can further include one or more sensors 210 configured to obtain a measurement of electromagnetic radiation in a second wavelength range. In some embodiments, the workpiece 110 can be at least partially transparent to electromagnetic radiation at the second wavelength range. Based on the measurement from the one or more sensors 210, the temperature of the workpiece 110 can be determined. For example, an intensity of thermal radiation measured by the one or more sensors 210 can be compared to a plot, graph, lookup table, etc. of temperature against thermal radiation intensity at a wavelength to determine the temperature of the workpiece 110. The one or more sensors 210 can include, for instance, a photo diode, pyrometer, or other suitable sensor.

In some embodiments, the one or more sensors 210 can obtain a measurement of electromagnetic radiation in a second wavelength range during a time at which the one or more heat sources 130 are not emitting radiation. For example, the one or more heat sources 130 can be pulsed on and off (e.g. at a high frequency) and the one or more sensors 210 can obtain measurements during the times at which the one or more heat sources 130 are off. By pulsing the one or more heat sources 130 in addition to and/or alternatively to obtaining a measurement in a second wavelength range different from the first wavelength range, the contamination from the one or more heat sources 130 to the measurements taken by the one or more sensors 210 can be reduced, allowing for accurate measurement by the one or more sensors 210, while still providing for efficient heating of the workpiece 110.

In some embodiments, the one or more sensors 210 can include a field of view of at least a portion of the workpiece 110 through one or more sensor windows 230. The one or more sensor windows 230 can be transparent to the second wavelength range. In some embodiments, the one or more sensor windows 230 can be configured to restrict wavelengths other than the second wavelength range. For instance, the one or more sensor windows 230 can be positioned between the workpiece and the one or more sensors 210 to limit interference of electromagnetic radiation other than that which the one or more sensors 210 is configured to measure, or to prevent damage to the one or more sensors 210 from, e.g., debris or thermal conditions in the processing chamber 105. For example, the one or more sensor windows 230 can be configured to at least partially block thermal radiation from components in the processing chamber 105 other than the workpiece 110 and/or the one or more additional heat sources 220. For example, the one or more sensor windows 230 can be configured to be at least partially opaque to electromagnetic radiation emitted by the one or more heat sources 130. In embodiments with more than one sensor 210, each sensor 210 can include a separate sensor window 230, or more than one sensor 210 can be positioned to view the workpiece 110 through the same window 230. In some embodiments, the one or more sensor windows 230 can be implemented in a hole in a wall of the processing chamber 105.

Thermal processing apparatus 200 can further include one or more windows 215, such as quartz windows, positioned between the one or more heat source arrays 170A, 170B and the workpiece 110. The windows 215 can be at least partially transparent to at least a portion of the electromagnetic radiation in the processing chamber 105. For instance, the windows 215 can be at least partially transparent to electromagnetic radiation in at least a first wavelength range (e.g. electromagnetic radiation emitted by the one or more heat sources 130) and/or a second wavelength range (e.g. electromagnetic radiation emitted by one or more additional heat sources 220 and/or emitted by the workpiece 110).

In some embodiments, the workpiece 110 can be at least partially transparent to the electromagnetic radiation in the second wavelength range 225. In this way, the electromagnetic radiation in the second wavelength range 225 can at least partially pass through the workpiece 110 to the side of the processing chamber 105 opposite the one or more additional radiation sources 220.

In some embodiments, the one or more sensors can be configured to obtain a measurement of the electromagnetic radiation at the second wavelength range after it has passed through the workpiece. In this way, the transmittance of the workpiece can be determined by comparing the intensity of electromagnetic radiation emitted by the one or more additional radiation sources to the intensity of the electromagnetic radiation measured by the one or more sensors. For example, the transmittance can be determined based at least in part on a ratio of the intensity of the electromagnetic radiation measured by the one or more sensors 210 to the intensity of the electromagnetic radiation emitted by the one or more additional radiation sources 220.

Figure 3:
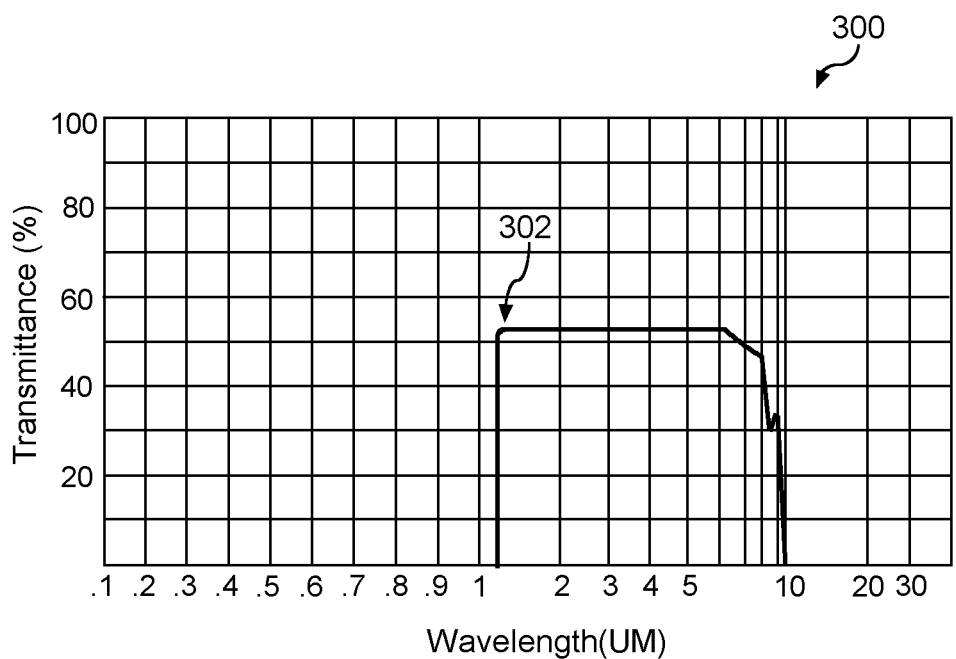
FIG. 3 depicts an example transmittance spectrum of an example workpiece material according to example embodiments of the present disclosure.

FIG. 3 illustrates an example graph 300 of transmittance over a range of wavelengths for an example workpiece material. As can be seen by curve 302, the workpiece material can have a transmittance of greater than zero over a portion of the electromagnetic spectrum. In accordance with some example embodiments of the present disclosure, it may be desirable to select a second wavelength range within the range of about 1 micrometer to about 10 micrometers for a workpiece made of the example workpiece material for which the transmittance is illustrated in FIG. 3.

In some embodiments, the intensity of the electromagnetic radiation emitted by the one or more additional radiation sources 220 can change with respect to time, in which the measurement of electromagnetic radiation in the second wavelength range 225 from the one or more sensors 210 can still be used to determine the transmittance and thus the temperature of the workpiece 110. For instance, the change in intensity of the one or more additional radiation sources 220 can be compensated for in the measurement of electromagnetic radiation obtained by the one or more sensors 210.

The measurement of electromagnetic radiation at the second wavelength range obtained by the one or more sensors 210 can change along with the temperature of the workpiece 110, even if the output from the one or more additional radiation sources 220 is constant. Other properties of the workpiece 110 and/or thermal processing system 200, such as workpiece thickness, composition, etc., can be determined to be constant throughout the change in temperature. In this way, the measurement from the one or more sensors 210 can be directly associated with the temperature of the workpiece 110 (e.g. as a change in temperature between the initial temperature and the current temperature) as a function of the transmittance of the workpiece 110.

In some embodiments, the temperature of the workpiece can be determined based at least in part on the transmittance of the workpiece. For instance, the transmittance of the workpiece can change with the temperature of the workpiece. For example, the transmittance of the workpiece can change as a function of at least the temperature of the workpiece. Other factors that may be associated with the transmittance of the workpiece, such as but not limited to the shape of the workpiece, thickness of the workpiece, composition of the workpiece, etc. can be measured or otherwise known or determined.

Figure 4:
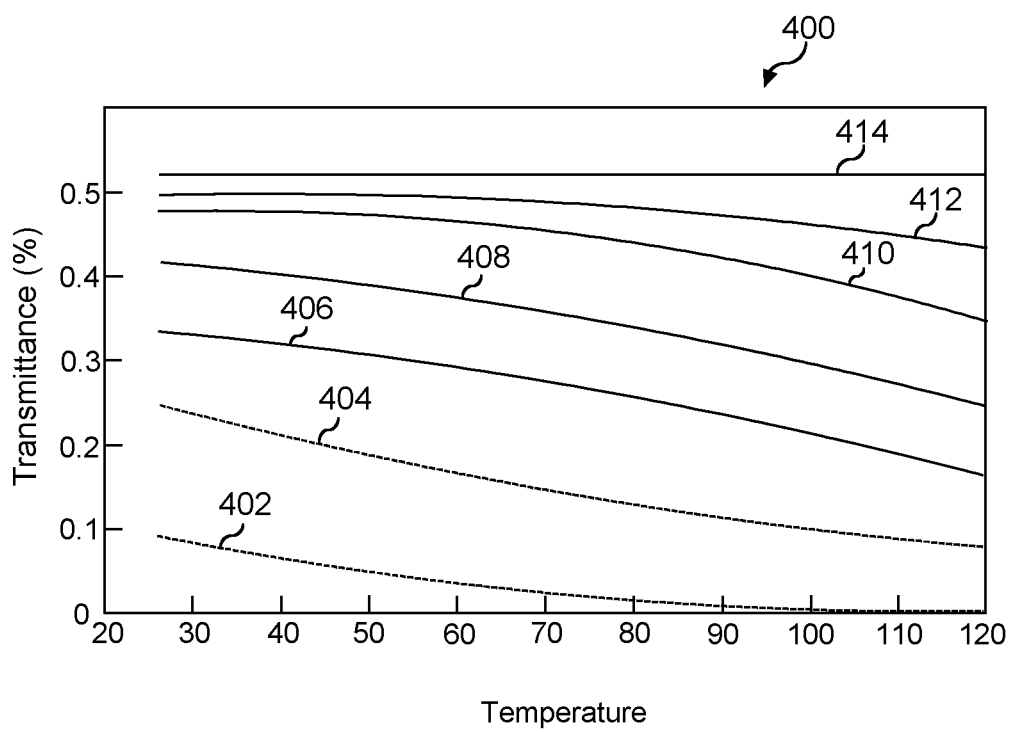
FIG. 4 depicts an example change in transmittance with respect to temperature of an example workpiece material according to example embodiments of the present disclosure.

For example, FIG. 4 illustrates an example graph 400 of transmittance change as a result of temperature at various wavelengths for an example workpiece material that can at least partially compose a workpiece (e.g. workpiece 110). In particular, each of the curves 402-414 corresponds to transmittance of the workpiece material at a unique wavelength. As can be seen in FIG. 4, the transmittance of a workpiece material at a particular wavelength experiences slight variation as the temperature of the material changes. As such, a sensor measuring intensity of electromagnetic radiation transmitted through the material will experience a change in intensity as a result of temperature. This change in intensity can thus be correlated to a change in temperature and used to determine a change in temperature and/or the temperature of the workpiece.

In some embodiments, a reference transmittance spectrum can be determined. The reference transmittance spectrum can be determined, in some embodiments, based at least in part on measurements associated with a plurality of different wavelengths. During thermal processing, the transmittance of the workpiece can be measured. The temperature of the workpiece can be determined based at least in part on a comparison between the reference transmittance spectrum and the measured transmittance of the workpiece.

In some embodiments, the reference transmittance spectrum can be indicative of a temperature of a workpiece 110 based at least in part on the transmittance of the workpiece 110. For example, in some embodiments, the reference transmission spectrum can be based at least in part on measured transmittances at a plurality of temperatures for one or more reference workpieces. The one or more reference workpieces can share one or more characteristics with the workpiece 110. In some embodiments, the reference workpiece can be the workpiece 110 to be thermally processed. In some embodiments, the measured transmittances can be measured in the processing chamber 105 according to the present disclosure. In some embodiments, a separate apparatus can be used to obtain the measured transmittances.

In embodiments where the reference transmittance spectrum is based at least in part on measured transmittances, the reference transmittance spectrum can include a model or equation, lookup table, or any other suitable reference transmittance spectrum. For example, the measured transmittances can be used to extrapolate a mathematical model or equation for transmittance as a function of at least temperature (e.g. such as one of curves 402-414). In some embodiments, the model or equation can be calibrated based at least in part on additional characteristics, such as but not limited to thickness of the workpiece 110, composition of the workpiece 110, or any other suitable characteristics, or combination thereof. For example, the model can be adjustable based on a thickness of the workpiece 110 so that several substantially similar workpieces having varying thicknesses (e.g. within a range or percent error of thickness) can be associated with the same model. In some embodiments, a separate model or equation can be used for each thickness, and the thickness of the workpiece to be processed can be rounded to the closest thickness having a reference transmittance spectrum. In some embodiments, the model or equation can be independent of thickness.

As another example, the measured transmittances can be used to populate a lookup table correlating transmittance to temperature for a workpiece. For example, various lookup tables can be populated based at least in part on various characteristics of the workpieces from which the measurements are obtained. In some embodiments, the lookup table data can be manipulated after being retrieved based on the various characteristics. For example, if a transmittance of a workpiece 110 measured during thermal processing (e.g. by sensor(s) 210 and/or additional radiation source(s) 220) falls between two values in the lookup table, the two values can be averaged by a weighted sum. As another example, a multiplier at least partially representative of some characteristic of a workpiece, such as thickness, can be used to slightly adjust the lookup table, e.g. without requiring population of an entirely different lookup table based on the characteristic.

In some embodiments, the reference transmittance spectrum can be based at least in part on approximate or simulated data, or other data that is not directly measured from a workpiece. For example, an equation or model based on physical and/or chemical properties of a workpiece can be generated for the workpiece. For example, the model can be based on a computer simulation, or based on transmittance of one or more materials comprising the workpiece, or other similar model.

In some embodiments, the reference transmittance spectrum can be calibrated to provide an accurate correlation between transmittance and temperature for a given workpiece 110. For example, one or more parameters, variables, etc. of a model or equation can be adjusted based on the workpiece 110. As another example, a reference transmittance spectrum can be selected from a plurality of candidate reference transmittance spectrums for the workpiece 110.

In some embodiments, the reference transmittance spectrum can be calibrated by matching a reference transmittance measured from the workpiece 110 to the reference transmittance spectrum. For example, the reference transmittance can be measured from the workpiece at a known initial temperature. In one embodiment, the reference transmittance can be compared to a candidate reference transmittance spectrum known to closely correspond to the transmittance of the workpiece 110 to adjust the candidate reference transmittance spectrum to more accurately correspond to the workpiece. As another example, the reference transmittance can be compared to points on a plurality of candidate reference transmittance spectrums to select which of the plurality of candidate reference transmittance spectrums most accurately represents the workpiece 110, such as points associated with the temperature at which the reference transmittance is measured. Any other suitable method of calibrating a reference transmittance spectrum can be used in accordance with the present disclosure.

By correlating the measured transmittance to the reference transmittance spectrum, the temperature of the workpiece 110 can thus be determined. For example, the measured transmittance can be an input into a model or equation correlating transmittance and temperature. As another example, the measured transmittance can be mapped to a point on an X-Y plot with transmittance on one axis (e.g. the vertical axis) and temperature on the other (e.g. the horizontal axis such as one or more of curves 402-414. As another example, the measured transmittance can be an input into a lookup table of temperatures. Thus, the measured transmittance can be used to accurately and indirectly determine the temperature of the workpiece.

As another example, a signal change at the one or more sensors 210 that occurs as a result of the change in transmittance of the workpiece 110 can be used to determine the temperature of the workpiece 110. For example, at a first temperature of the workpiece, the one or more sensors can measure a first intensity of the electromagnetic radiation in the second wavelength range 225. At a second temperature of the workpiece 110, the one or more sensors can measure a second intensity of the electromagnetic radiation in the second wavelength range 225.

As an example, the temperature of the workpiece 110 can be determined based at least in part on the difference between the first intensity and the second intensity. For example, the first temperature can be known and the second temperature can be unknown, and the first temperature and the first intensity can be used to establish a reference point on a model such as an equation, curve, set of data, or other suitable model correlating intensity and temperature (e.g. for a given workpiece). The model can be determined based on simulated or estimated data (e.g. based on one or more properties of the workpiece) and/or measured data (e.g. measured from the workpiece 110 and/or one or more other workpieces having similar characteristics to the workpiece). For example, the model can be determined in similar fashion to the reference transmittance spectrum described above. The second intensity can then be used to establish a second point on the model, and the second temperature can thus be determined based on the second point. Any other suitable methods known in the art can be used to determine the temperature of the workpiece 110 based on the measurement obtained by the one or more sensors 210.

Figure 5:
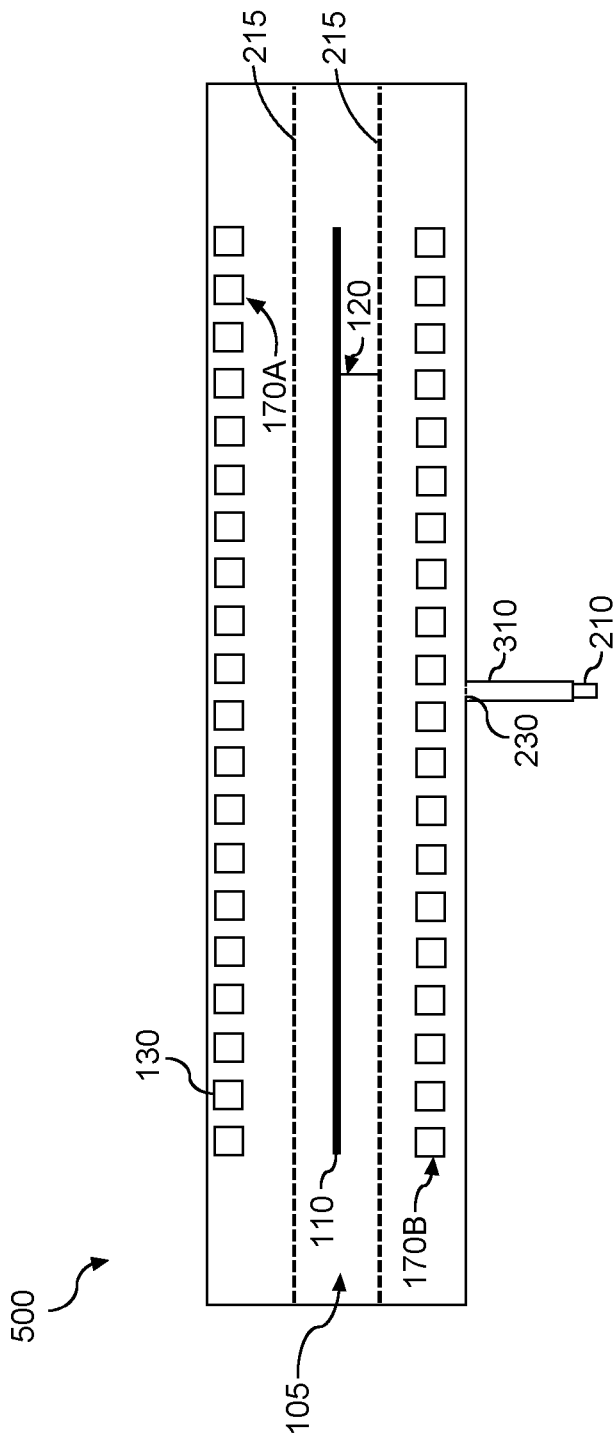
FIG. 5 depicts an example thermal processing apparatus according to example embodiments of the present disclosure.

Referring now to FIG. 5, an example thermal processing apparatus 500 is discussed with respect to the present disclosure. Some components discussed with respect to thermal processing apparatus 100 of FIG. 1 and/or thermal processing apparatus 200 of FIG. 2 are omitted with respect to thermal processing apparatus 500 of FIG. 5 for the purposes of discussion herein. However, some embodiments of thermal processing apparatus 500 can include some or all of the components discussed with respect to FIG. 1 and/or FIG. 2.

FIG. 5 illustrates a thermal processing apparatus 500 having substantially similar components to thermal processing apparatus 100 of FIG. 1 and/or thermal processing apparatus 200 of FIG. 2. For example, thermal processing apparatus 500 can include a workpiece 110, workpiece support 120, one or more heat source arrays 170A, 170B each having one or more heat sources 130, one or more sensors 210, one or more windows 215, and/or one or more sensor windows 230.

In some embodiments, the field of view of the one or more sensors 210 can be restricted by one or more cooled sight tubes and/or cooled apertures 310. For instance, the one or more cooled sight tubes and/or cooled apertures 310 can be configured to reduce interference of electromagnetic radiation other than that which the one or more sensors 210 is configured to measure, or to prevent damage to the one or more sensors 210 from, e.g., debris or thermal conditions in the processing chamber. For example, the one or more cooled sight tubes and/or cooled apertures 310 can direct the field of view of the one or more sensors 210 substantially toward the workpiece 110 to prevent interference from undesired electromagnetic radiation. For example, the one or more cooled tubes and/or cooled apertures 310 can be configured to at least partially block thermal radiation from components in the processing chamber 105 other than the workpiece 110. As another example, the one or more cooled sight tubes and/or cooled apertures 310 can prevent damage to the one or more sensors 210.

In some embodiments, one or more sensor windows 230 can be positioned adjacent to and/or within the one or more cooled sight tubes and/or cooled apertures 310. The one or more sensor windows 230 can be transparent to the second wavelength range. In some embodiments, the one or more sensor windows 230 can be configured to restrict wavelengths other than the second wavelength range. For instance, the one or more sensor windows 230 can be positioned between the workpiece and the one or more sensors 210 to limit interference of electromagnetic radiation other than that which the one or more sensors 210 is configured to measure, or to prevent damage to the one or more sensors 210 from, e.g., debris or thermal conditions in the processing chamber 105. For example, the one or more sensor windows 230 can be configured to at least partially block thermal radiation from components in the processing chamber 105 other than the workpiece 110 and/or the one or more additional heat sources 220. For example, the one or more sensor windows 230 can be configured to be at least partially opaque to electromagnetic radiation emitted by the one or more heat sources 130. In embodiments with more than one sensor 210, each sensor 210 can include a separate sensor window 230, or more than one sensor 210 can be positioned to view the workpiece 110 through the same window 230.

In some embodiments, the one or more sensors 210 can be configured to obtain a measurement of electromagnetic radiation in the second wavelength range, and the second wavelength range can encompass at least a portion of a range of thermal radiation emitted by the workpiece 110. The thermal radiation emitted by the workpiece 110 can vary with the temperature of the workpiece 110. Thus, a measurement of thermal radiation emitted by the workpiece 110 in the second wavelength range can be obtained and compared to the emissivity and/or an expected amount of thermal radiation emitted by the workpiece 110 at the second wavelength range across a plurality of temperatures to determine the temperature of the workpiece 110.

For instance, the thermal radiation of the workpiece can be a function of both black-body radiation emitted by an ideal black body at the temperature of the workpiece 110 and the emissivity of the workpiece 110. The emissivity of the workpiece 110 can be expressed as a ratio between the amount of thermal radiation emitted by the workpiece 110 at a particular wavelength and temperature and the amount of thermal radiation emitted by an ideal black body at the particular wavelength and temperature. In some cases, at least a portion of the black-body curve and the emissivity curve for a workpiece (e.g. workpiece 110) can be inversely related, leading to challenges in selecting a second wavelength range at which a suitably high amount of thermal radiation is emitted.

In some embodiments, to measure the thermal radiation emitted by the workpiece 110 at a particular temperature, a wavelength band can be selected for measurement that has a relatively high magnitude on a black-body graph at the temperature while also having a relatively high emissivity constant for the workpiece 110.

In some embodiments, the second wavelength range can be selected based at least in part on one or more local features associated with emissivity of the workpiece 110. For example, an emissivity curve of the workpiece 110 may have one or more local maxima that provide a relatively higher emissivity at a particular wavelength than at surrounding wavelengths. Especially in cases where the black-body curve and emissivity curve are inversely related, the local features can correspond to relatively desirable wavelengths for thermal radiation measurement, provided that the local features correspond to wavelengths that are desirable in view of the other considerations discussed herein. For example, the workpiece 110 may emit a higher amount of thermal radiation in wavelengths at the one or more local features than at wavelengths immediately surrounding the one or more local features.

Figure 6:
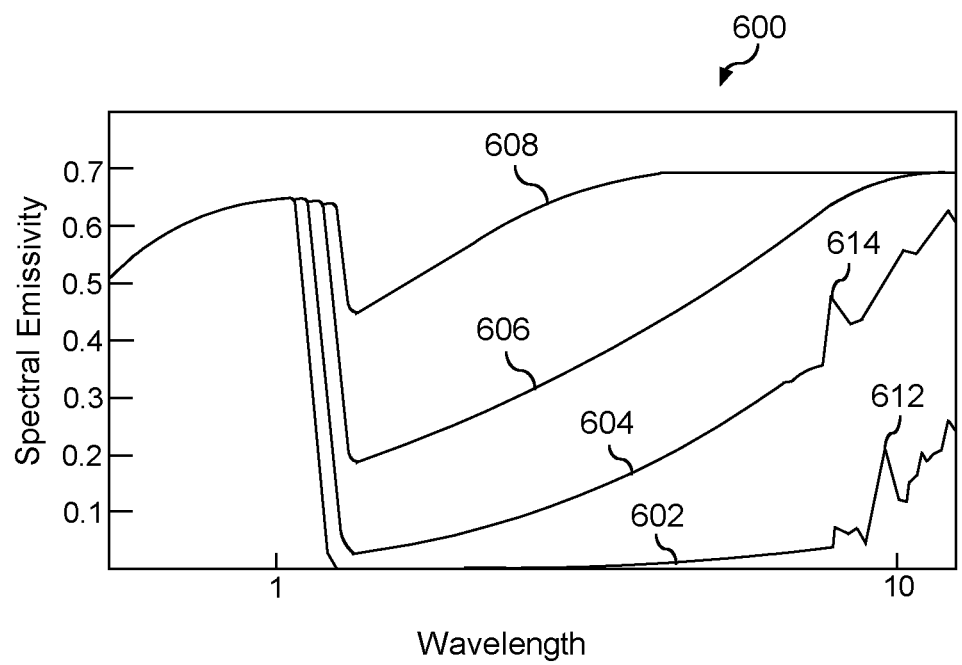
FIG. 6 depicts an example emissivity spectrum for an example workpiece according to example embodiments of the present disclosure.

An example emissivity spectrum 600 for an example workpiece material that can at least partially compose a workpiece (e.g. workpiece 110) is illustrated in FIG. 6. The curves 602-608 illustrate the emissivity at different temperatures. For example, curve 602 can represent emissivity at a relatively low temperature (e.g. less than 300° C.) and curve 608 can represent emissivity at a relatively high temperature (e.g. greater than 700° C.). As can be seen in curves 602 and 604, the emissivity can have one or more local features (e.g. local peaks 612 and 614) corresponding to unevenness in the emissivity curve. For example, local peaks 612 and 614 represent wavelengths at which the emissivity is relatively higher at the wavelength than at surrounding wavelengths, leading to relatively higher emissions of thermal radiation at the wavelength.

Figure 7:
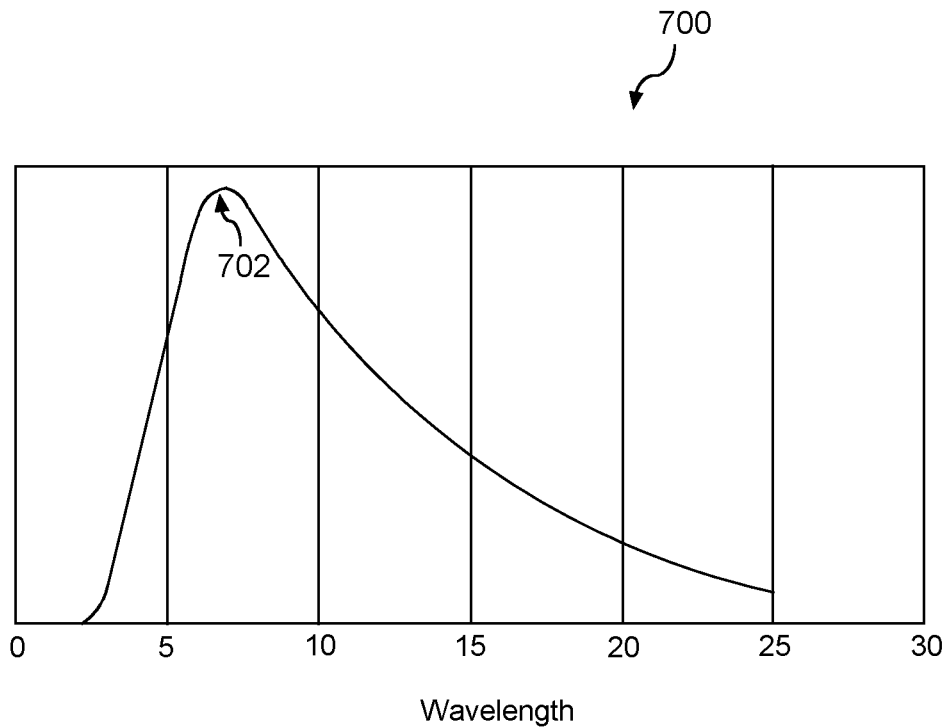
FIG. 7 depicts an example black-body radiation curve at an example temperature according to example embodiments of the present disclosure.

An example black-body curve 700 at an example temperature, such as the temperature of the workpiece 110, is illustrated in FIG. 7. As can be seen by curve 700, the black-body radiation at a temperature can have a peak 702 corresponding to a wavelength at which the most thermal radiation is emitted by an ideal black body at the example temperature. Furthermore, as can be seen by a comparison of curve 700 to any of curves 602-608 illustrated in FIG. 6, the emissivity and black-body coefficient at a temperature for an object can have portions that in some cases can be inversely related, or in other cases completely unrelated.

In some embodiments, emissivity characteristics (e.g. at least a portion of at least one of curves 602-608) for a workpiece (e.g. workpiece 110) can be obtained in-situ, i.e. without removing the workpiece 110 from the processing chamber.

In some embodiments, the emissivity of a workpiece 110 can be measured by interacting electromagnetic radiation from one or more measurement radiation sources (not illustrated) at a known intensity with the workpiece 110 and measuring the intensity of the electromagnetic radiation emitted by the one or more measurement radiation sources after interaction with the workpiece 110. For example, the one or more measurement radiation sources can be any suitable radiation source, such as the one or more heat sources 130 used to heat the workpiece 110, the one or more additional radiation sources 220, or any other suitable radiation source. In some embodiments, the workpiece 110 can be at least partially transparent to the electromagnetic radiation emitted by the one or more measurement radiation sources. In this way, a first portion of the electromagnetic radiation emitted by the one or more measurement radiation sources can pass through the workpiece 110 to a side of the processing chamber 105 opposite the one or more measurement radiation sources and a second portion of the electromagnetic radiation can be reflected off a surface of the workpiece 110.

For example, in an exemplary embodiment wherein the workpiece 110 includes a lightly-doped silicon wafer at 100° C., the workpiece 110 may not be fully opaque for wavelengths under about 25 μm. As such, to measure the emissivity of the workpiece 110, the transmittance of the workpiece 110 and the reflectance of the workpiece 110 can be measured. For instance, the transmittance can be determined as a ratio of the intensity of the first portion of electromagnetic radiation that has passed through the workpiece 110 to the intensity of the electromagnetic radiation emitted by the one or more measurement radiation sources. The reflectance can be determined as a ratio of the intensity of the second portion of electromagnetic radiation that is reflected by the workpiece 110 to the intensity of the electromagnetic radiation emitted by the one or more measurement radiation sources. Any electromagnetic radiation that is not accounted for by the sum of transmittance and reflectance thus corresponds to electromagnetic radiation absorbed by the workpiece. In thermal equilibrium, the amount of energy emitted by the workpiece 110 can be the same as the amount of energy absorbed by the workpiece 110. In this way, emissivity of the workpiece 110 can be measured.

Based on the measured temperature of the workpiece 110, one or more process parameters of the thermal processing system 100, 200, 500 can be controlled (e.g. by controller 175, processor(s) 176, and/or memory device(s) 177). For instance, the measured temperature can be used in a feedback loop, and the intensity of the one or more heat sources 130 can be controlled to adjust and/or maintain the temperature of the workpiece 110. For instance, the intensity of the one or more heat sources 130 can be adjusted to heat the workpiece 110 to a desired processing temperature.

Figure 8:
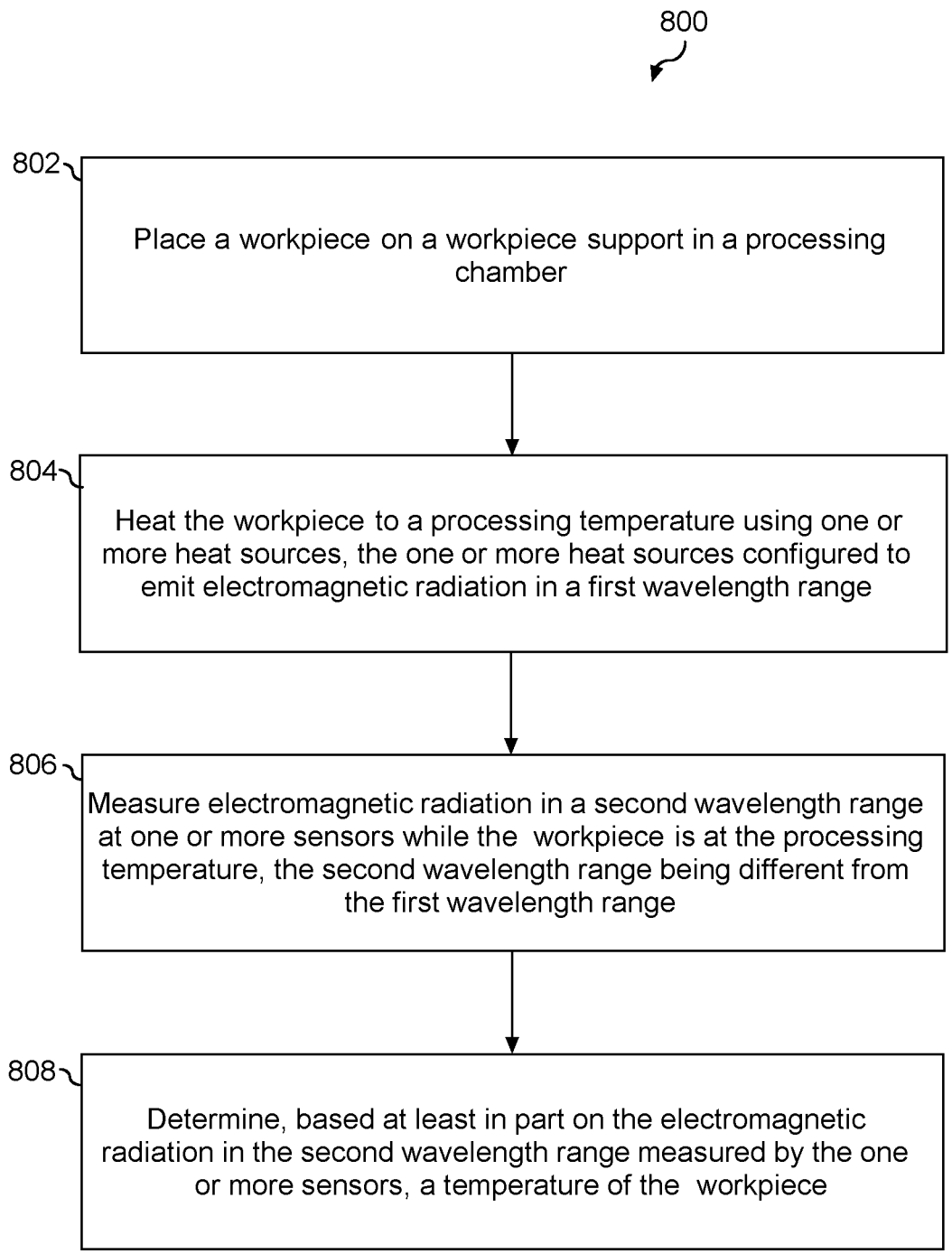
FIG. 8 depicts an example method for thermal processing of a workpiece according to example embodiments of the present disclosure.

FIG. 8 depicts a flow diagram of a process (800) for measuring temperature of a workpiece in a thermal processing chamber according to example embodiments of the present disclosure. The process (800) can be implemented using the thermal processing system 100 of FIG. 1, thermal processing system 200 of FIG. 2, and/or thermal processing system 500 of FIG. 5. However, as will be discussed in detail below, the process (800) according to example aspects of the present disclosure can be implemented using other thermal processing systems without deviating from the scope of the present disclosure. FIG. 8 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (802), the process can include placing a workpiece on a workpiece support in a processing chamber. For example, the workpiece can be a workpiece described in accordance with the present disclosure, such as workpiece 110. The workpiece support can be, for example, workpiece support 120. The thermal processing chamber can be, for example, processing chamber 105. The workpiece can have any suitable shape, composition, and/or other characteristics. The workpiece support can have any suitable shape, configuration, and/or other characteristics. The processing chamber can have any suitable shape, configuration, and/or other characteristics.

At (804), the process can include heating the workpiece to a processing temperature using one or more heat sources, the one or more heat sources configured to emit electromagnetic radiation in a first wavelength range. For example, the one or more heat sources can be the heat sources 130. The one or more heat sources can be, for example, light sources or other radiative heat sources. The one or more heat sources can be operable to heat the workpiece without physical contact between the heat source and the workpiece. For example, the one or more heat sources can include infrared light sources, light-emitting diodes (LEDs), pulsed heat sources, coherent light sources, narrow-band heat sources, or other suitable heat sources, or combination thereof. For example, the one or more heat sources can be narrow-band heat sources such as LEDs to reduce or limit contamination of electromagnetic radiation outside of the first wavelength range.

The one or more heat sources can be configured to emit electromagnetic radiation in the first wavelength range to heat the workpiece. The first wavelength range can be selected such that the workpiece has a suitable absorptance, such as a suitably high absorptance, of electromagnetic radiation in the first wavelength range. For instance, the first wavelength range can have a suitably high absorptance such that the workpiece is able to absorb radiation in the first wavelength range, such as an amount of the radiation suitable to heat the workpiece in an efficient manner. For instance, the first wavelength range can include a wavelength at which the workpiece has an absorptance of about 0.5 or higher, such as about 0.7 or higher. By absorbing a suitable portion of the energy carried by the electromagnetic radiation, the workpiece can thus be heated. However, any suitable wavelength range can be used for the first wavelength range. In some embodiments, the workpiece can be heated to about 50° C. to 150° C., such as to about 100° C.

Additionally and/or alternatively, the first wavelength range can be selected to provide a suitable absorptance based at least in part on a temperature of the workpiece. For instance, the absorptance of the workpiece can change with temperature, and it can be desirable to select the first wavelength to provide an adequate absorptance at a desired temperature. For example, the first wavelength range can be selected to provide a suitable absorptance at an initial temperature of the workpiece (i.e. before the workpiece is heated by the one or more heat sources), at a processing temperature (i.e. a temperature at which the workpiece is heated to and/or maintained at during thermal processing), over a range of temperatures (e.g. over a range from an initial temperature to a processing temperature), or over any suitable temperature or temperatures, or combination thereof. In some embodiments, the temperature can be from about 50° C. to about 150° C. In some embodiments, the temperature can be about 100° C.

In one example application of heating a including a lightly-doped silicon wafer to a process temperature of about 100° C., the one or more heat sources can include high-power monochromatic LEDs configured to provide electromagnetic radiation at about 900 nm. At 100° C., a lightly-doped silicon wafer can have an absorptance of about 0.7 for electromagnetic radiation with a wavelength of about 900 nm. The LEDs can be a narrow-band heat source, and thus emit negligible radiation in wavelengths other than about 900 nm. As such, the 900 nm LEDs can provide adequate capability to heat the workpiece, provide limited interference in other wavelengths, and avoid complications that may be associated with electromagnetic radiation having shorter wavelengths, such as UV light. However, any suitable heat sources with any suitable wavelength range can be used in accordance with the aspects of the present disclosure.

At (806), the process can include measuring electromagnetic radiation in a second wavelength range at one or more sensors while the workpiece is at the processing temperature, the second wavelength range being different from the first wavelength range and/or not overlapping with the first wavelength range. For example, the one or more sensors can be the one or more sensors 210. In some embodiments, the workpiece can be at least partially transparent to the second wavelength range. In some embodiments, the second wavelength range can correspond to a wavelength range at which the workpiece emits a substantial amount of thermal radiation. Based on the measurement from the one or more sensors, the temperature of the workpiece can be determined. The one or more sensors can include, for instance, a photo diode, pyrometer, or any other suitable sensor.

The second wavelength range can be different from the first wavelength range and/or may not overlap with the first wavelength range. For instance, the first wavelength range and the second wavelength range can be selected to reduce or limit contamination between the first wavelength range and the second wavelength range. As an example, the second wavelength range can be selected to be a wavelength range outside of a radiation band emitted by the one or more heat sources. For example, the first wavelength range can include a wavelength of about 900 nm and the second wavelength range can include a wavelength of about 1100 nm. In some embodiments, a spectral power density associated with radiation from the heat source in the second wavelength range can be less than about 5% of the peak spectral power density associated with the second wavelength range, such as less than about 1% of the peak spectral power density associated with the second wavelength range As another example, the second wavelength range can be a wavelength range having a different order of magnitude than the first wavelength. For example, the first wavelength range can include a wavelength having an order of magnitude of about 1000 nm, such as 900 nm, and the second wavelength range can include a wavelength having an order of magnitude of about 10 μm, such as in the range of about 13 μm to about 17 μm, such as about 16 μm. The second wavelength range in some embodiments can be in the range of about 8 μm to about 12 μm, such as about 9 μm, which may correspond to where Si—O bonds provide an absorption/emission peak.

In some embodiments, the one or more sensors can obtain a measurement of electromagnetic radiation in a second wavelength range during a time at which the one or more heat sources are not emitting radiation. For example, the one or more heat sources can be pulsed on and off (e.g. at a high frequency) and the one or more sensors can obtain measurements during the times at which the one or more heat sources are off. By pulsing the one or more heat sources in addition to and/or alternatively to obtaining a measurement in a second wavelength range different from the first wavelength range, the contamination from the one or more heat sources to the measurements taken by the one or more sensors can be reduced, allowing for accurate measurement by the one or more sensors, while still providing for efficient heating of the workpiece.

In some embodiments, despite obtaining a measurement in a second wavelength range different from the first wavelength range emitted by the one or more heat sources, the one or more sensors may nonetheless be sensitive to undesired radiation. For instance, thermal radiation from components other than the workpiece, such as thermal radiation from other components within the processing chamber, may interfere with the measurement obtained by the one or more sensors. For example, thermal radiation from components, especially components at about the same temperature as the workpiece, may fall at least partially within the second wavelength range, or otherwise serve to contaminate the measurement obtained by the one or more sensors.

In some embodiments, the one or more sensors can include a field of view of at least a portion of the workpiece through one or more windows. The one or more windows can be transparent to the second wavelength range. In some embodiments, the one or more windows can be configured to restrict wavelengths other than the second wavelength range. For instance, the one or more windows can be positioned between the workpiece and the one or more sensors to limit interference of electromagnetic radiation other than that which the one or more sensors are configured to measure, or to prevent damage to the one or more sensors from, e.g., debris or thermal conditions in the processing chamber. For example, the one or more windows can be configured to at least partially block thermal radiation from components in the processing chamber other than the workpiece. In embodiments with more than one sensor, each sensor can include a separate window, or more than one sensor can be positioned to view the workpiece through the same window. In some embodiments, the one or more windows can be implemented in a hole in a wall of the processing chamber.

In some embodiments, the field of view of the one or more sensors can be restricted by one or more cooled sight tubes and/or cooled apertures. For instance, the one or more cooled sight tubes and/or cooled apertures can be configured to reduce interference of electromagnetic radiation other than that which the one or more sensors are configured to measure, or to prevent damage to the one or more sensors from, e.g., debris or thermal conditions in the processing chamber. For example, the one or more cooled sight tubes and/or cooled apertures can direct the field of view of the one or more sensors substantially toward the workpiece to prevent interference from undesired electromagnetic radiation. For example, the cooled tubes and/or cooled apertures can be configured to at least partially block thermal radiation from components in the processing chamber other than the workpiece. As another example, the cooled sight tubes and/or cooled apertures can prevent damage to the one or more sensors.

At (808), the process can include determining, based at least in part on the electromagnetic radiation in the second wavelength range measured by the one or more sensors, a temperature of the workpiece. For example, the electromagnetic radiation in the second wavelength range can be indicative of transmittance of the workpiece, and the temperature of the workpiece can be determined based at least in part on the transmittance of the workpiece. As another example, the electromagnetic radiation in the second wavelength range can be indicative of thermal radiation emitted by the workpiece, and the temperature of the workpiece can be determined based at least in part on the thermal radiation emitted by the workpiece.

Figure 9:
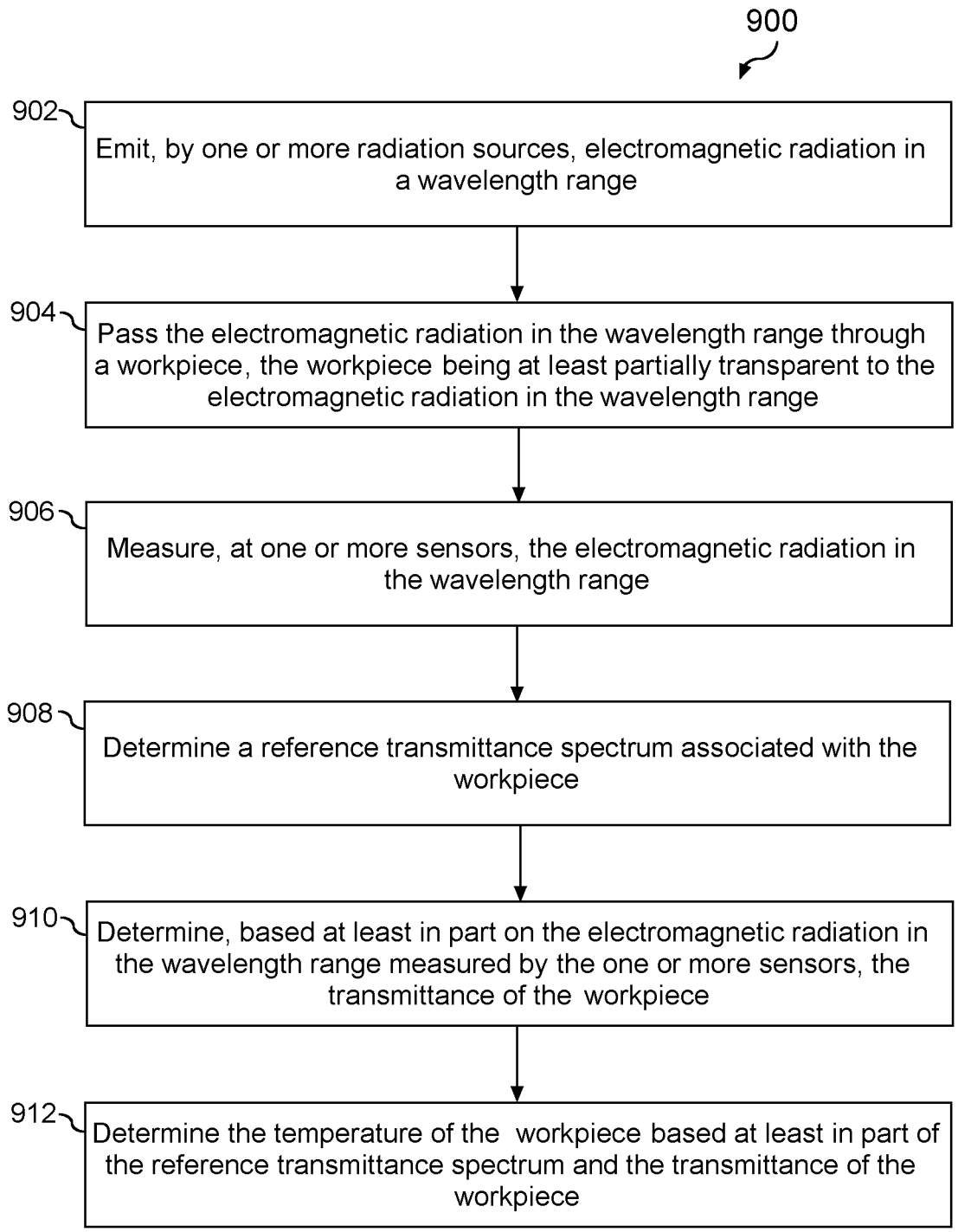
FIG. 9 depicts an example method for determining temperature of a workpiece according to example embodiments of the present disclosure.

FIG. 9 depicts a flow diagram of a process (900) for determining temperature of a workpiece in a thermal processing chamber based at least in part on a measurement of electromagnetic radiation according to example embodiments of the present disclosure. The process (900) can be implemented using the thermal processing system 100 of FIG. 1, thermal processing system 200 of FIG. 2, and/or thermal processing system 500 of FIG. 5. However, as will be discussed in detail below, the process (900) according to example aspects of the present disclosure can be implemented using other thermal processing systems without deviating from the scope of the present disclosure. FIG. 9 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (902), the process can include emitting, by one or more additional radiation sources, electromagnetic radiation in a second wavelength range. For example, the one or more additional radiation sources can be the one or more additional radiation sources 220. For instance, the one or more additional radiation sources can be configured to emit electromagnetic radiation in the second wavelength range. The one or more additional radiation sources can be positioned such that the emitted radiation is generally perpendicular (e.g. within about 10° of perpendicular) to a surface of a workpiece or has any other suitable angle with respect to the surface of the workpiece. In some embodiments, the one or more additional radiation sources can be positioned substantially opposite one or more sensors. For example, each of the one or more additional radiation sources can be positioned on the opposite side of the processing chamber from and in linear orientation with each of the one or more sensors. Any other suitable orientation for the one or more sensors and/or the one or more additional radiation sources can be used in accordance with the present disclosure. The one or more additional radiation sources can include, for example, lasers (e.g. laser diodes), infrared light sources, ultraviolet (UV) light sources, light-emitting diodes (LEDs), pulsed radiation sources, coherent light sources, narrow-band radiation sources, or other suitable radiation sources, or combination thereof. In some embodiments, the one or more additional radiation sources can be positioned behind one or more windows.

At (904), the electromagnetic radiation in the second wavelength range emitted by the one or more additional radiation sources can be passed through a workpiece. For example, the workpiece can be workpiece 110. For instance, in some embodiments, the workpiece can be at least partially transparent to the electromagnetic radiation in the second wavelength range. For example, the workpiece can have a transmittance of greater than about zero at the second wavelength range. In this way, the electromagnetic radiation in the second wavelength range can at least partially pass through the workpiece to the side of the processing chamber opposite the one or more additional radiation sources.

At (906), the process can include measuring, at one or more sensors, the electromagnetic radiation in the second wavelength range. For example, the one or more sensors can be one or more sensors 210. For instance, in some embodiments, the one or more sensors can be configured to obtain a measurement of the electromagnetic radiation at the second wavelength range after it has passed through the workpiece. In this way, the transmittance of the workpiece can be determined by comparing the intensity of electromagnetic radiation emitted by the one or more additional radiation sources to the intensity of the electromagnetic radiation measured by the one or more sensors.

At (908), the process can include determining a reference transmittance spectrum associated with the workpiece. For example, in some embodiments, the reference transmittance spectrum can be indicative of a temperature of a workpiece based at least in part on the transmittance of the workpiece. In some embodiments, the reference transmittance spectrum can be calibrated to provide an accurate correlation between transmittance and temperature for a given workpiece. For example, one or more parameters, variables, etc. of a model or equation can be adjusted based on the workpiece. As another example, a reference transmittance spectrum can be selected from a plurality of candidate reference transmittance spectrums for the workpiece.

At (910), the process can include determining, based at least in part on the electromagnetic radiation in the second wavelength range measured by the one or more sensors, the transmittance of the workpiece. For instance, the transmittance of the workpiece can change with the temperature of the workpiece. For example, the transmittance of the workpiece can change as a function of at least the temperature of the workpiece. Other factors that may be associated with the transmittance of the workpiece, such as but not limited to the shape of the workpiece, thickness of the workpiece, composition of the workpiece, etc. can be measured or otherwise known or determined. In some embodiments, a reference transmittance spectrum can be determined, and the transmittance of the workpiece during thermal processing can be measured.

At (912), the process can include determining the temperature of the workpiece based at least in part on the reference transmittance spectrum and the transmittance of the workpiece. For example, the measurement of electromagnetic radiation at the second wavelength range obtained by the one or more sensors can change along with the temperature of the workpiece, even if the output from the one or more additional radiation sources is constant. Other properties of the workpiece and/or thermal processing system, such as workpiece thickness, composition, etc., can be determined to be constant throughout the change in temperature. In this way, the measurement from the one or more sensors can be directly associated with the temperature of the workpiece (e.g. as a change in temperature between the initial temperature and the current temperature) as a function of the transmittance of the workpiece.

Figure 10:
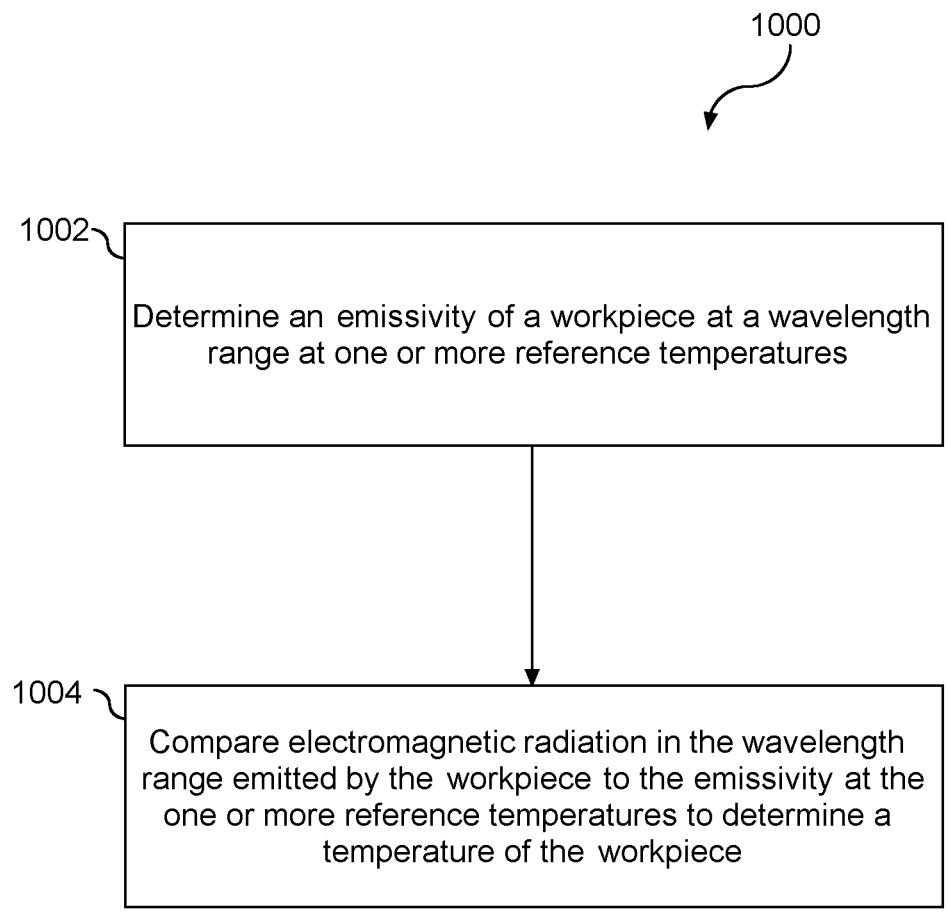
FIG. 10 depicts an example method for determining temperature of a workpiece according to example embodiments of the present disclosure.

FIG. 10 depicts a flow diagram of a process (1000) for determining temperature of a workpiece in a thermal processing chamber based at least in part on a measurement of electromagnetic radiation according to example embodiments of the present disclosure. The process (1000) can be implemented using the thermal processing system 100 of FIG. 1, thermal processing system 200 of FIG. 2, and/or thermal processing system 500 of FIG. 5. However, as will be discussed in detail below, the process (1000) according to example aspects of the present disclosure can be implemented using other thermal processing systems without deviating from the scope of the present disclosure. FIG. 10 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (1002), the process can include determining an emissivity of a workpiece at a second wavelength range at one or more reference temperatures. For example, the workpiece can be workpiece 110. For example, in some embodiments, the emissivity of a workpiece can be measured by interacting electromagnetic radiation from one or more measurement radiation sources at a known intensity with the workpiece and measuring the intensity of the electromagnetic radiation emitted by the one or more measurement radiation sources after interaction with the workpiece. For example, the one or more measurement radiation sources can be any suitable radiation source, such as the one or more heat sources used to heat the workpiece, the one or more additional radiation sources, or any other suitable radiation source. In some embodiments, the workpiece can be at least partially transparent to the electromagnetic radiation emitted by the one or more measurement radiation sources. In this way, a first portion of the electromagnetic radiation emitted by the one or more measurement radiation sources can pass through the workpiece to a side of the processing chamber opposite the one or more measurement radiation sources and a second portion of the electromagnetic radiation can be reflected off a surface of the workpiece. The first portion and second portion can be measured and used to determine the emissivity of the workpiece. This can be repeated across one or more reference temperatures to determine the emissivity of the workpiece at the one or more reference temperatures.

At (1004), the process can include comparing the electromagnetic radiation in the second wavelength range emitted by a workpiece to the emissivity at the one or more reference temperatures to determine the temperature of the workpiece. For example, in some embodiments, the second wavelength range can correspond to a wavelength range at which the workpiece emits a substantial amount of thermal radiation. Based on the measurement from the one or more sensors, the temperature of the workpiece can be determined. For example, an intensity of thermal radiation measured by the one or more sensors can be compared to a plot, graph, lookup table, etc. of temperature against thermal radiation intensity at a wavelength to determine the temperature of the workpiece.

Based on the measured temperature of the workpiece, one or more process parameters of the thermal processing system can be controlled. For instance, the measured temperature can be used in a feedback loop, and the intensity of the one or more heat sources can be controlled to adjust and/or maintain the temperature of the workpiece. For instance, the intensity of the one or more heat sources can be adjusted to heat the workpiece to a desired processing temperature.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A thermal processing apparatus comprising:
a processing chamber having a workpiece support, the workpiece support configured to support a workpiece;
a first heat source and a second heat source, each of the first and second heat source configured to emit electromagnetic radiation in a first wavelength range in a range from about 850 nanometers to about 950 nanometers to heat the workpiece to a processing temperature of from about 50° C. to about 150° C., wherein the first heat source is configured to heat a top surface of the workpiece and the second heat source is configured to heat a backside of the workpiece;
one or more additional radiation sources configured to emit electromagnetic radiation in a second wavelength range, wherein the second wavelength range comprises a wavelength from about 7 micrometers to about 12 micrometers, wherein the workpiece is at least partially transparent to the electromagnetic radiation in the second wavelength range;
a first sensor configured to obtain a measurement of electromagnetic radiation in the second wavelength range when the workpiece is at the processing temperature, wherein the second wavelength range does not overlap with the first wavelength range, wherein a spectral power density associated with the radiation from the heat source in the second wavelength range is less than about 5% of a peak spectral power density associated with the second wavelength range; and
a first window disposed between the first heat source and the workpiece and a second window disposed between the second heat source and the workpiece, the first window and second window configured to restrict wavelengths other than the second wavelength range, the first window and second window each having a first side facing the workpiece and a second and opposite side, wherein the first window and the second window comprise quartz.

2. The thermal processing apparatus of claim 1, comprising one or more processors configured to determine a temperature of the workpiece based at least in part on the measurement of electromagnetic radiation obtained by the one or more sensors.

3. The thermal processing apparatus of claim 1, wherein the one or more heat sources emit electromagnetic radiation in a narrow band infrared range.

4. The thermal processing apparatus of claim 1, wherein the first wavelength range is such that the workpiece has an absorptance of greater than about 0.5 at the first wavelength range and at the processing temperature.

5. The thermal processing apparatus of claim 1, wherein the apparatus comprises a cooled aperture or a cooled tube to restrict a field of view of the one or more sensors.

6. The thermal processing apparatus of claim 1, wherein the one or more sensors are configured to measure electromagnetic radiation in the second wavelength range during a time period when the one or more heat sources are not emitting electromagnetic radiation in the first wavelength range.

7. The thermal processing apparatus of claim 1, wherein the one or more heat sources comprise one or more light emitting diodes.

8. The thermal processing apparatus of claim 1, wherein the workpiece comprises lightly-doped silicon.

9. The thermal processing apparatus of claim 1, wherein the electromagnetic radiation in the second wavelength range passes through the workpiece prior to being measured by the one or more sensors.

10. The thermal processing apparatus of claim 9, wherein the second wavelength range comprises a wavelength longer than about 1000 nanometers.

11. The thermal processing apparatus of claim 1, wherein the measurement obtained by the one or more sensors is indicative of a transmittance of the workpiece, wherein the apparatus comprises one or more processors are configured to determine the temperature of the workpiece at least in part by comparing the measurement obtained by the one or more sensors indicative of the transmittance of the workpiece to a reference transmittance spectrum for a specimen having a known initial temperature.

12. The thermal processing apparatus of claim 1, wherein the apparatus comprises one or more processors are configured to determine the temperature of the workpiece based at least in part on an emissivity of the workpiece, wherein the emissivity of the workpiece is measured in-situ.

13. The thermal processing apparatus of claim 1, wherein the one or more additional radiation sources are positioned such that the emitted radiation is within about 10° of perpendicular to a surface of the workpiece.

14. The thermal processing apparatus of claim 1, wherein the one or more additional radiation sources are positioned behind either the first window or the second window.

* * * * *